(12) United States Patent
Weitekamp et al.

(10) Patent No.: US 9,207,532 B2
(45) Date of Patent: Dec. 8, 2015

(54) PHOTOINITIATED OLEFIN METHATHESIS POLYMERIZATION

(71) Applicant: CALIFORNIA INSTITUTE OF TECHNOLOGY, Pasadena, CA (US)

(72) Inventors: Raymond Weitekamp, Glendale, CA (US); Robert H. Grubbs, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 79 days.

(21) Appl. No.: 14/044,974

(22) Filed: Oct. 3, 2013

(65) Prior Publication Data

US 2014/0099573 A1    Apr. 10, 2014

Related U.S. Application Data

(60) Provisional application No. 61/710,461, filed on Oct. 5, 2012, provisional application No. 61/772,824, filed on Mar. 5, 2013.

(51) Int. Cl.
```
G03F 7/004     (2006.01)
G03F 7/20      (2006.01)
G03F 7/029     (2006.01)
```

(52) U.S. Cl.
CPC .............. *G03F 7/0042* (2013.01); *G03F 7/029* (2013.01); *G03F 7/20* (2013.01)

(58) Field of Classification Search
CPC .......... G03F 7/0042; G03F 7/20; G03F 7/029
USPC ........... 430/18, 9; 40/427, 453, 446; 428/195, 428/98
See application file for complete search history.

(56) References Cited

U.S. PATENT DOCUMENTS

| | | | |
|---|---|---|---|
| 5,312,940 A * | 5/1994 | Grubbs et al. | 556/136 |
| 5,342,909 A | 8/1994 | Grubbs et al. | |
| 5,750,815 A | 5/1998 | Grubbs et al. | |
| 5,831,108 A | 11/1998 | Grubbs et al. | |
| 5,917,071 A | 6/1999 | Grubbs et al. | |
| 5,969,170 A | 10/1999 | Grubbs et al. | |
| 5,977,393 A | 11/1999 | Grubbs et al. | |
| 6,048,993 A | 4/2000 | Grubbs et al. | |
| 6,111,121 A | 8/2000 | Grubbs et al. | |
| 6,153,778 A | 11/2000 | Grubbs et al. | |
| 6,211,391 B1 | 4/2001 | Grubbs et al. | |
| 6,284,852 B1 | 9/2001 | Grubbs et al. | |
| 6,313,332 B1 | 11/2001 | Grubbs et al. | |
| 6,426,419 B1 | 7/2002 | Grubbs et al. | |
| 6,486,279 B2 | 11/2002 | Lynn et al. | |
| 6,504,041 B2 | 1/2003 | Grubbs et al. | |
| 6,514,666 B1 | 2/2003 | Choi et al. | |
| 6,515,084 B2 | 2/2003 | Grubbs et al. | |
| 6,552,139 B1 * | 4/2003 | Herrmann et al. | 526/171 |
| 6,624,265 B2 | 9/2003 | Grubbs et al. | |
| 6,635,768 B1 * | 10/2003 | Herrmann et al. | 548/101 |
| 6,759,537 B2 | 7/2004 | Grubbs et al. | |
| 6,787,620 B2 * | 9/2004 | Herrmann et al. | 526/171 |
| 6,806,325 B2 | 10/2004 | Grubbs et al. | |
| 6,818,586 B2 | 11/2004 | Grubbs et al. | |
| 7,102,047 B2 | 9/2006 | Grubbs et al. | |
| 7,288,666 B2 | 10/2007 | Grubbs et al. | |
| 7,294,717 B2 | 11/2007 | Herrmann et al. | |
| 7,329,758 B1 * | 2/2008 | Grubbs et al. | 548/103 |
| 7,378,528 B2 | 5/2008 | Herrmann et al. | |
| 7,652,145 B2 | 1/2010 | Herrmann et al. | |
| 7,750,172 B2 | 7/2010 | Grubbs et al. | |
| 2001/0039360 A1 | 11/2001 | Grubbs et al. | |
| 2002/0013473 A1 | 1/2002 | Grubbs et al. | |
| 2002/0022733 A1 | 2/2002 | Grubbs et al. | |
| 2002/0055598 A1 | 5/2002 | Lynn et al. | |
| 2002/0177710 A1 * | 11/2002 | Grubbs et al. | 546/2 |
| 2003/0069374 A1 * | 4/2003 | Grubbs et al. | 526/171 |
| 2003/0181609 A1 | 9/2003 | Grubbs et al. | |
| 2005/0113590 A1 | 5/2005 | Grubbs et al. | |
| 2006/0241317 A1 | 10/2006 | Grubbs et al. | |
| 2009/0012248 A1 | 1/2009 | Grubbs et al. | |
| 2009/0012254 A1 | 1/2009 | Grubbs et al. | |
| 2011/0124868 A1 * | 5/2011 | Grubbs et al. | 546/4 |

OTHER PUBLICATIONS

Khalimon et al, Photogeneration of a Phosphonium Alylidene Olefin Metathesis Catalyst, Jun. 28, 2012, Organometallics, A-D.*
Louie et al., "Metathesis of Electron-Rich Olefins: Structure and Reactivity of Electron-Rich Carbene Complexes", Organometallics, 2002, 21, 2153-2164.
Khalimon et al., "Photogeneration of a Phosphomium Alkylidene Olefin Metethesis Catalyst", Organometallics, 2012, 5634-5637.

* cited by examiner

*Primary Examiner* — Ling Choi
*Assistant Examiner* — Jessica E Whiteley
(74) *Attorney, Agent, or Firm* — Baker & Hostetler LLP

(57) ABSTRACT

The present invention provides photosensitive compositions and methods of patterning a polymeric image on a substrate, said methods comprising; (a) depositing a layer of photosensitive composition of any one of claims 15 to 22 on the substrate; and (b) irradiating a portion of the layer of photosensitive composition with a light comprising a wavelength in a range of from about 220 to about 440 nm. The invention also relates to methods of metathesizing an unsaturated organic precursor comprising irradiating Fischer-type carbene ruthenium catalysts with at least one wavelength of light in the presence of at least one unsaturated organic precursor so as to metathesize at least one alkene or one alkyne bond.

40 Claims, 5 Drawing Sheets

PHOTOINITIATED OLEFIN METHATHESIS POLYMERIZATION

CROSS REFERENCE TO RELATED APPLICATIONS

This Application claims the benefit of U.S. Provisional Application Ser. Nos. 61/710,461, filed Oct. 5, 2012 and 61/772,824, filed Mar. 5, 2013, both of which are incorporated by reference in their entirety for all purposes.

TECHNICAL FIELD

The present invention relates to photolithographic compositions. It also relates to metathesis reactions catalyzed by organometallic coordination compounds, particularly by Fischer-type ruthenium carbene catalysts.

BACKGROUND

Photolithography is the patterning technique at the foundation of microfabrication, the core of modern integrated circuit technology. In a photoresist, the pattern of optical irradiation is converted to a pattern of chemically distinct regions, typically through photoinitiated functional group cleavage or crosslinking. Many modern photoresists employ the concept of "chemical amplification," in which a photogenerated catalyst reacts with many sites. For example, photoacid generators are commonly employed in chemically amplified resists, either to catalyze a ring opening polymerization or initiate a cascade of deprotective bond scissions within a polymer matrix, imparting new solubility properties to the irradiated regions. While there are a number of light-mediated reactions that could be, in principle, employed in photolithography, very few have been implemented. Despite the fact that there are hundreds of commercially available photoresists, the functional diversity amongst these materials is severely limited. In most applications, the photoresist serves the sole purpose of a sacrificial mask or mold; very rarely is the resist material incorporated as a structural element or chemically functional interface. The ability to generate new kinds of chemically functional materials directly via photolithography would enable a host of new applications, for example in microelectromechanical systems (MEMS), microfluidics, patterned biomaterials and artificial optical materials. Olefin metathesis is a robust synthetic methodology that has led to new polymeric materials with many applications, such as drug delivery, organic electronics, and photonic crystals.

SUMMARY

Certain embodiments provide methods of metathesizing an unsaturated organic precursor, each method comprising irradiating a Fischer-type carbene ruthenium catalyst with at least one wavelength of light in the presence of at least one unsaturated organic precursor, so as to metathesize at least one set of alkene or one alkyne bonds.

In other of these embodiments, the Fischer-type carbene ruthenium catalyst is generated in situ by the reaction between:
a quenching agent of

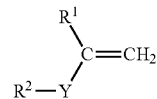

and a Grubbs-type metathesis catalyst of Formula (I)

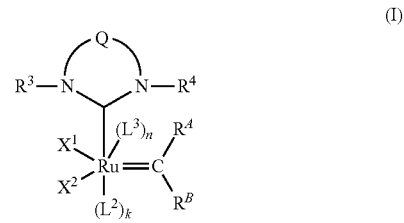

wherein:
  $L^2$, and $L^3$ are neutral electron donor ligands;
  k and n are independently 0 or 1;
  $X^1$ and $X^2$ are anionic ligands;
  Y is O, N—$R^1$, or S, preferably O or N—$R^1$; and
  Q is a two-atom linkage having the structure —$CR^{11}R^{12}$—$CR^{13}R^{14}$— or —$CR^{11}$=$CR^{13}$—, preferably —$CR^{11}R^{12}$—$CR^{13}R^{14}$—, wherein $R^{11}$, $R^{12}$, $R^{13}$, and $R^{14}$ are independently selected from hydrogen, hydrocarbyl, substituted hydrocarbyl, heteroatom-containing hydrocarbyl, substituted heteroatom-containing hydrocarbyl, and functional groups.
  $R^1$, $R^2$, $R^A$, and $R^B$ are independently selected from hydrogen, optionally substituted hydrocarbyl, optionally substituted heteroatom-containing hydrocarbyl, functional groups, or may be linked to form a cyclic group, which may be aliphatic or aromatic, and may contain substituents and/or heteroatoms;
  $R^3$ and $R^4$ are independently hydrogen, optionally substituted hydrocarbyl, or optionally substituted heteroatom-containing hydrocarbyl; and
  wherein any two or more of $X^1$, $X^2$, $L^1$, $L^2$, $L^3$, $R^1$, and $R^2$ can be taken together to form one or more cyclic groups.

In other of these embodiments, the Fischer-type carbene ruthenium catalyst is represented by the structure of Formula (II):

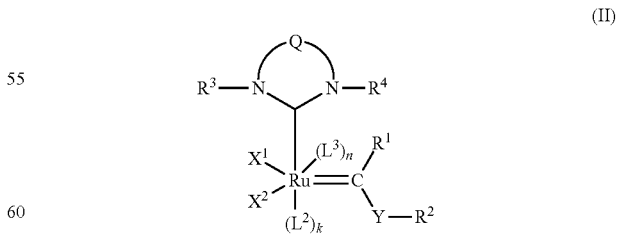

wherein $L^2$, $L^3$, k, n, $X^1$, $X^2$, Y, Q, $R^1$, $R^2$, $R^3$, and $R^4$ are as described above.

The invention also includes embodiments comprising photosensitive compositions, including photoresist compositions, each composition comprising a Fischer-type carbene ruthenium catalyst admixed (dissolved) within a matrix of at least one unsaturated organic precursor, wherein the ruthenium carbene catalyst is activated by irradiation of light comprising at least one wavelength in a range of from about 220 to about 440 nm, preferably in a range of from about 240 to about 260 nm, or from about 260 nm to about 340 nm, or from about 340 to about 360 nm, or a combination thereof.

Still other embodiments include methods of patterning a polymeric image on a substrate, each method comprising; (a) depositing a layer of photosensitive composition on the substrate, said photosensitive composition comprising a Fischer-type carbene ruthenium catalyst admixed or dissolved within a matrix of at least one unsaturated organic precursor; (b) irradiating a portion of the layer of photosensitive composition with a light comprising a wavelength in a range of from about 220 to about 440 nm, preferably in a range of from about 240 to about 260 nm, of from about 260 nm to about 340 nm, or from about 340 to about 360 nm, or a combination thereof, so as to polymerize the irradiated portion of the layer, thereby providing a patterned layer of polymerized and unpolymerized regions.

BRIEF DESCRIPTION OF THE DRAWINGS

The present application is further understood when read in conjunction with the appended drawings. For the purpose of illustrating the subject matter, there are shown in the drawings exemplary embodiments of the subject matter; however, the presently disclosed subject matter is not limited to the specific methods, devices, and systems disclosed. In addition, the drawings are not necessarily drawn to scale. In the drawings.

DETAILED DESCRIPTION OF ILLUSTRATIVE EMBODIMENTS

Figure 1:
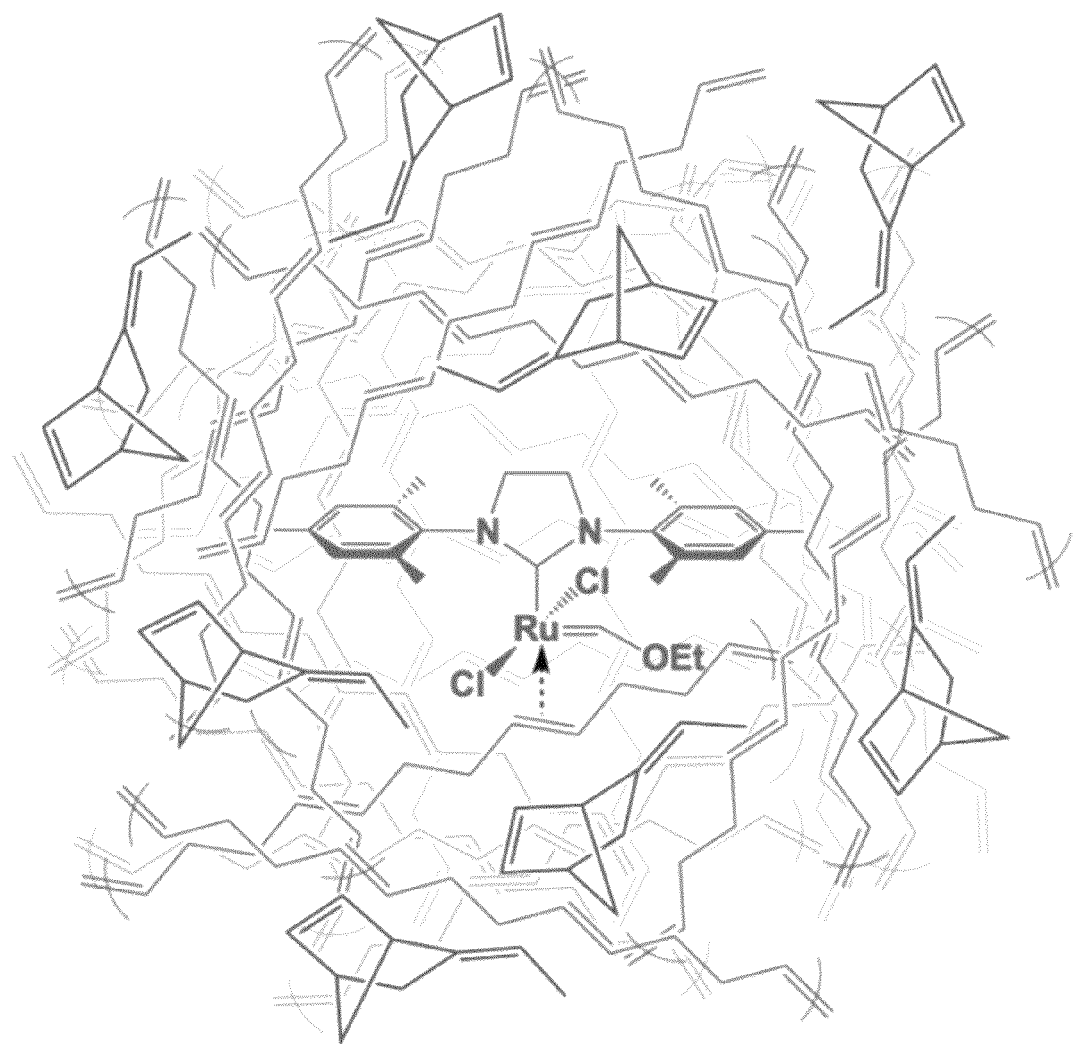
FIG. 1 is a cartoon depicting the proposed environment of the PLOMP resist. While not being bound by the correctness of any particular theory, it is believed that the viscous, olefin rich solution stabilized the sensitive vinyl ether complex through dative bonding, as depicted. The photoactivated catalyst crosslinks the ethylidene norbornene molecules into the matrix of poly(COD).

The present invention relates to method of metathesizing olefins using catalysts previously considered to be practically inactive. These methods provide for novel photosensitive compositions, their use as photoresists, and methods related to patterning polymer layers on substrates.

Patterning functional materials is a central challenge across many fields of science. The ability to lithographically fabricate micro- and nanostructures has been one of the most impactful technological breakthroughs of the last century. In part due to the complexity of the chemical processes in photoresists, there is a limited variety of materials that can currently be patterned with photolithography. The present invention provides for the use of a wide variety of materials in negative tone photoresists using photoactivated olefin metathesis catalysts, which can be quickly prepared in a one-pot synthesis from commercially available starting materials. In some embodiments, the resist is based on substituted ruthenium vinyl ether complexes, widely regarded as practically inactive towards olefin metathesis. The combination of these photoactivated catalyst with the fidelity and functional group tolerance of ruthenium-mediated olefin metathesis enables a host of new possibilities for photopatterned materials.

The present invention may be understood more readily by reference to the following description taken in connection with the accompanying Figures and Examples, all of which form a part of this disclosure. It is to be understood that this invention is not limited to the specific products, methods, conditions or parameters described or shown herein, and that the terminology used herein is for the purpose of describing particular embodiments by way of example only and is not intended to be limiting of any claimed invention. Similarly, unless specifically otherwise stated, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer to compositions and methods of making and using said compositions. That is, where the disclosure describes or claims a feature or embodiment associated with a composition or a method of making or using a composition, it is appreciated that such a description or claim is intended to extend these features or embodiment to embodiments in each of these contexts (i.e., compositions, methods of making, and methods of using).

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When a value is expressed as an approximation by use of the descriptor "about," it will be understood that the particular value forms another embodiment. In general, use of the term "about" indicates approximations that can vary depending on the desired properties sought to be obtained by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, references to values stated in ranges include every value within that range.

It is to be appreciated that certain features of the invention which are, for clarity, described herein in the context of separate embodiments, may also be provided in combination in a single embodiment. That is, unless obviously incompatible or specifically excluded, each individual embodiment is deemed to be combinable with any other embodiment(s) and such a combination is considered to be another embodiment. Conversely, various features of the invention that are, for brevity, described in the context of a single embodiment, may also be provided separately or in any sub-combination. Finally, while an embodiment may be described as part of a series of steps or part of a more general structure, each said step may also be considered an independent embodiment in itself, combinable with others.

The transitional terms "comprising," "consisting essentially of," and "consisting" are intended to connote their generally in accepted meanings in the patent vernacular; that is, (i) "comprising," which is synonymous with "including," "containing," or "characterized by," is inclusive or open-ended and does not exclude additional, unrecited elements or method steps; (ii) "consisting of" excludes any element, step, or ingredient not specified in the claim; and (iii) "consisting essentially of" limits the scope of a claim to the specified materials or steps "and those that do not materially affect the basic and novel characteristic(s)" of the claimed invention. Embodiments described in terms of the phrase "comprising" (or its equivalents), also provide, as embodiments, those which are independently described in terms of "consisting of" and "consisting essentially" of. For those embodiments provided in terms of "consisting essentially of," the basic and novel characteristic(s) is the operability of the methods (or the compositions or devices derived therefrom) as providing a photochemically activated metathesis system.

When a list is presented, unless stated otherwise, it is to be understood that each individual element of that list, and every combination of that list, is a separate embodiment. For example, a list of embodiments presented as "A, B, or C" is to be interpreted as including the embodiments, "A," "B," "C," "A or B," "A or C," "B or C," or "A, B, or C."

Throughout this specification, words are to be afforded their normal meaning, as would be understood by those skilled in the relevant art. However, so as to avoid misunderstanding, the meanings of certain terms will be specifically defined or clarified.

General Metathesis Description

The present invention includes embodiments related to methods of metathesizing unsaturated organic precursors, each method comprising irradiating a Fischer-type carbine ruthenium catalyst with at least one wavelength of light in the presence of at least one unsaturated organic precursor, so as to metathesize at least one alkene or one alkyne bond within the at least one precursors. For purposes of the present disclosure, so-called "Fischer-type" carbenes are defined, as comprising a non-persistent carbene having pi-donor substituents, such as alkoxy and alkylated amino groups, on the carbene atom. These Fischer-type carbenes are distinguished from so-call "Schrock-type" type carbenes which have only hydrogen and alkyl substituents on the non-persistent carbenoid carbon. Alkoxy and alkylated amino groups on the carbene carbon render Fischer-type carbenes, especially those of ruthenium, virtually inert relative to their "Schrock-type" cogeners. In fact, the addition of substituted vinyl ethers or vinyl amines, for example, can virtually inactivate a ruthenium metathesis catalyst containing a "Schrock-type" carbene, by forming the corresponding Fischer-type derivative. These Fischer-type carbene complexes are widely considered inactive due to the electronics of the carbene. In fact, ethyl vinyl ether is commonly used to quench ROMP reactions. The following descriptions now demonstrate that these "quenched" complexes undergo further chemistry when photochemically activated.

Catalysts

Fischer-type carbene complexes are generally characterized as comprising low oxidation state Co, Cr, Fe, Mn, and W metal centers:

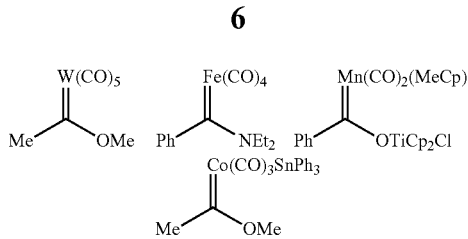

The primary, though not exclusive focus, of the present invention involves the use of higher oxidation state metals, including complexes based on Group 8 metals, such as Os and Ru. In the present invention, Fischer-type carbene complexes based on ruthenium are especially preferred, particularly those further characterized as Grubbs' catalysts. These catalysts have been described, inter alia, in U.S. Pat. Nos. 5,312,940; 5,342,909; 5,750,815; 5,831,108; 5,917,071; 5,969,170; 5,977,393; 6,048,993; 6,111,121; 6,153,778; 6,211,391; 6,284,852; 6,313,332; 6,426,419; 6,486,279; 6,504,041; 6,515,084; 6,624,265; 6,759,537; 6,806,325; 6,818,586; 7,102,047; 7,288,666; 7,329,758; and 7,750,172 and U.S. Patent Application Publ. Nos. 2001/0039360; 2002/0013473; 2002/0022733; 2002/0055598; 2002/0177710; 2003/0069374; 2003/0181609; 2005/0113590; 2006/0241317; 2009/0012248; 2009/0012254; and 2011/0124868, each of which is incorporated by reference for its teaching of catalyst and catalyst precursor structure. The present invention is especially directed to compounds which may be characterized by the umbrella of "Grubb's catalysts" in which the non-persistent carbene is contains an O, N, or S bonded directly to the Ru=C carbene moiety; i.e., is also described as containing a Fischer-type carbene.

In certain embodiments, the Fischer-type carbene ruthenium catalyst used in the photochemically activated metathesis or compositions is generated in situ by the reaction between:

a quenching agent of

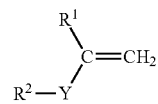

and a Grubbs-type metathesis catalyst of Formula (I)

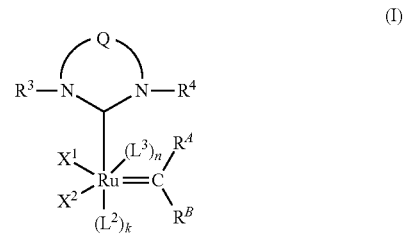

wherein:
$L^2$, and $L^3$ are neutral electron donor ligands;
k and n are independently 0 or 1;
$X^1$ and $X^2$ are anionic ligands;
Y is O, $N(R^2)$, or S, preferably O or N(H); and
Q is a two-atom linkage having the structure —$CR^{11}R^{12}$—$CR^{13}R^{14}$— or —$CR^{11}=CR^{13}$—, preferably —$CR^{11}R^{12}$—$CR^{13}R^{14}$—, wherein $R^{11}$, $R^{12}$, $R^{13}$ and $R^{14}$ are independently selected from hydrogen, hydrocarbyl, substituted hydrocarbyl, heteroatom-containing hydrocarbyl, substituted heteroatom-containing hydrocarbyl, and functional groups.

$R^1$, $R^2$, $R^A$, and $R^B$ are independently selected from hydrogen, optionally substituted hydrocarbyl, optionally substituted heteroatom-containing hydrocarbyl, functional groups, or may be linked to form a cyclic group, which may be aliphatic or aromatic, and may contain substituents and/or heteroatoms;

$R^3$ and $R^4$ are independently hydrogen, optionally substituted hydrocarbyl, or optionally substituted heteroatom-containing hydrocarbyl; and wherein any two or more of $X^1$, $X^2$, $L^1$, $L^2$, $L^3$, $R^1$, and $R^2$ can be taken together to form one or more cyclic groups.

The Fischer-type carbene ruthenium catalyst may also be separately described or represented by the structure of Formula (II):

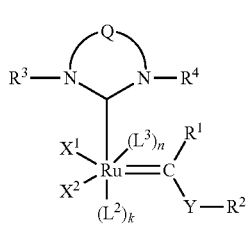

(II)

wherein $L^2$, $L^3$, k, n, Q, $R^1 R^2$, $R^3$, and $R^4$ are as described above.

In certain additional embodiments of the present invention, $X^1$, $X^2$, $L^2$, $L^3$, $R^1$, and $R^2$ are described as follows.

Throughout this specification, words are to be afforded their normal meaning, as would be understood by those skilled in the relevant art. However, so as to avoid misunderstanding, the meanings of certain terms will be specifically defined or clarified. By "substituted" as in "substituted hydrocarbyl," "substituted alkyl," "substituted aryl," and the like, as alluded to in some of the aforementioned definitions, is meant that in the hydrocarbyl, alkyl, aryl, heteroaryl, or other moiety, at least one hydrogen atom bound to a carbon (or other) atom is replaced with one or more non-hydrogen substituents. Examples of such substituents include, without limitation: functional groups referred to herein as "Fn," such as halo (e.g., F, Cl, Br, I), hydroxyl, sulfhydryl, $C_1$-$C_{24}$ alkoxy, $C_2$-$C_{24}$ alkenyloxy, $C_2$-$C_{24}$ alkynyloxy, $C_5$-$C_{24}$ aryloxy, $C_6$-$C_{24}$ aralkyloxy, $C_6$-$C_{24}$ alkaryloxy, acyl (including $C_1$-$C_{24}$ alkylcarbonyl (—CO-alkyl) and $C_6$-$C_{24}$ arylcarbonyl (—CO-aryl)), acyloxy (—O-acyl, including $C_2$-$C_{24}$ alkylcarbonyloxy (—O—CO-alkyl) and $C_6$-$C_{24}$ arylcarbonyloxy (—O—CO-aryl)), $C_2$-$C_{24}$ alkoxycarbonyl ((CO)—O-alkyl), $C_6$-$C_{24}$ aryloxycarbonyl (—(CO)—O-aryl), halocarbonyl (—CO)—X where X is halo, $C_2$-$C_{24}$ alkylcarbonato (—O—(CO)—O-alkyl), $C_6$-$C_{24}$ arylcarbonato (—O—(CO)—O-aryl), carboxy (—COOH), carboxylato (—COO—), carbamoyl (—(CO)—$NH_2$), mono-($C_1$-$C_{24}$ alkyl)-substituted carbamoyl (—(CO)NH($C_1$-$C_{24}$ alkyl)), di-($C_1$-$C_{24}$ alkyl)-substituted carbamoyl (—(CO)—N($C_1$-$C_{24}$ alkyl)$_2$), mono-($C_1$-$C_{24}$ haloalkyl)-substituted carbamoyl (—(CO)—NH($C_1$-$C_{24}$ alkyl)), di-($C_1$-$C_{24}$ haloalkyl)-substituted carbamoyl (—(CO)—N($C_1$-$C_{24}$ alkyl)$_2$), mono-($C_5$-$C_{24}$ aryl)-substituted carbamoyl (—(CO)—NH-aryl), di-($C_5$-$C_{24}$ aryl) substituted carbamoyl (—(CO)—N($C_5$-$C_{24}$ aryl)$_2$), di-N—($C_1$-$C_{24}$ alkyl), N—($C_5$-$C_{24}$ aryl)-substituted carbamoyl, thiocarbamoyl (—(CS)—$NH_2$), mono-($C_1$-$C_{24}$ alkyl)-substituted thiocarbamoyl (—(CO)—NH($C_1$-$C_{24}$ alkyl)), di-($C_1$-$C_{24}$ alkyl)-substituted thiocarbamoyl (—(CO)—N($C_1$-$C_{24}$ alkyl)$_2$), mono-($C_5$-$C_{24}$ aryl) substituted thiocarbamoyl (—(CO)—NH-aryl), di-($C_5$-$C_{24}$ aryl)-substituted thiocarbamoyl (—(CO)—N($C_5$-$C_{24}$ aryl)$_2$), di-N—($C_1$-$C_{24}$ alkyl), N—($C_5$-$C_{24}$ aryl)-substituted thiocarbamoyl, carbamido (—NH—(CO)—$NH_2$), cyano(—C≡N), cyanato (—O—C≡N), thiocyanato (—S—C≡N), formyl (—(CO)—H), thioformyl (—(CS)—H), amino (—$NH_2$), mono-($C_1$-$C_{24}$ alkyl)-substituted amino, di-($C_1$-$C_{24}$ alkyl)-substituted amino, mono-($C_5$-$C_{24}$ aryl) substituted amino, di-($C_5$-$C_{24}$ aryl)-substituted amino, $C_1$-$C_{24}$ alkylamido (—NH—(CO)-alkyl), $C_6$-$C_{24}$ arylamido (—NH—(CO)-aryl), imino (—CR=NH where R=hydrogen, $C_1$-$C_{24}$ alkyl, $C_5$-$C_{24}$ aryl, $C_6$-$C_{24}$ alkaryl, $C_6$-$C_{24}$ aralkyl, etc.), $C_2$-$C_{20}$ alkylimino (—CR=N(alkyl), where R=hydrogen, $C_1$-$C_{24}$ alkyl, $C_5$-$C_{24}$ aryl, $C_6$-$C_{24}$ alkaryl, $C_6$-$C_{24}$ aralkyl, etc.), arylimino (—CR=N(aryl), where R=hydrogen, $C_1$-$C_{20}$ alkyl, $C_5$-$C_{24}$ aryl, $C_6$-$C_{24}$ alkaryl, $C_6$-$C_{24}$ aralkyl, etc.), nitro (—$NO_2$), nitroso (—NO), sulfo (—$SO_2$OH), sulfonate ($SO_2$O—), $C_1$-$C_{24}$ alkylsulfanyl (—S-alkyl; also termed "alkylthio"), $C_5$-$C_{24}$ arylsulfanyl (—S-aryl; also termed "arylthio"), $C_1$-$C_{24}$ alkylsulfinyl (—(SO)-alkyl), $C_5$-$C_{24}$ arylsulfinyl (—(SO)-aryl), $C_1$-$C_{24}$ alkylsulfonyl (—$SO_2$-alkyl), $C_1$-$C_{24}$ monoalkylaminosulfonyl-$SO_2$—N(H)alkyl), $C_1$-$C_{24}$ dialkylaminosulfonyl-$SO_2$—N(alkyl)$_2$, $C_5$-$C_{24}$ arylsulfonyl (—$SO_2$-aryl), boryl (—$BH_2$), borono (—B(OH)$_2$), boronato (—B(OR)$_2$ where R is alkyl or other hydrocarbyl), phosphono (—P(O)(OH)$_2$), phosphonato (—P(O)(O)$_2$), phosphinato (P(O)(O—)), phospho (—$PO_2$), and phosphine (—$PH_2$); and the hydrocarbyl moieties $C_1$-$C_{24}$ alkyl (preferably $C_1$-$C_{12}$ alkyl, more preferably $C_1$-$C_6$ alkyl), $C_2$-$C_{24}$ alkenyl (preferably $C_2$-$C_{12}$ alkenyl, more preferably $C_2$-$C_6$ alkenyl), $C_2$-$C_{24}$ alkynyl (preferably $C_2$-$C_{12}$ alkynyl, more preferably C2-C6 alkynyl), $C_5$-$C_{24}$ aryl (preferably $C_5$-$C_{24}$ aryl), $C_6$-$C_{24}$ alkaryl (preferably $C_6$-$C_{16}$ alkaryl), and $C_6$-$C_{24}$ aralkyl (preferably $C_6$-$C_{16}$ aralkyl). Within these substituent structures, the "alkyl," "alkylene," "alkenyl," "alkenylene," "alkynyl," "alkynylene," "alkoxy," "aromatic," "aryl," "aryloxy," "alkaryl," and "aralkyl" moieties may be optionally fluorinated or perfluorinated. Additionally, reference to alcohols, aldehydes, amines, carboxylic acids, ketones, or other similarly reactive functional groups also includes their protected analogs. For example, reference to hydroxy or alcohol also includes those substituents wherein the hydroxy is protected by acetyl (Ac), benzoyl (Bz), benzyl (Bn, Bnl), β-Methoxyethoxymethyl ether (MEM), dimethoxytrityl, [bis-(4-methoxyphenyl)phenylmethyl] (DMT), methoxymethyl ether (MOM), methoxytrityl[(4-methoxyphenyl)diphenylmethyl, MMT), p-methoxybenzyl ether (PMB), methylthiomethyl ether, pivaloyl (Piv), tetrahydropyranyl (THP), tetrahydrofuran (THF), trityl (triphenylmethyl, Tr), silyl ether (most popular ones include trimethylsilyl (TMS), tert-butyldimethylsilyl (TBDMS), tri-iso-propylsilyloxymethyl (TOM), and triisopropylsilyl (TIPS) ethers), ethoxyethyl ethers (EE). Reference to amines also includes those substituents wherein the amine is protected by a BOC glycine, carbobenzyloxy (Cbz), p-methoxybenzyl carbonyl (Moz or MeOZ), tert-butyloxycarbonyl (BOC), 9-fluorenylmethyloxycarbonyl (FMOC), acetyl (Ac), benzoyl (Bz), benzyl (Bn), carbamate, p-methoxybenzyl (PMB), 3,4-dimethoxybenzyl (DMPM), p-methoxyphenyl (PMP), tosyl (Ts) group, or sulfonamide (Nosyl & Nps) group. Reference to substituent containing a carbonyl group also includes those substituents wherein the carbonyl is protected by an acetal or ketal, acylal, or diathane group. Reference to substituent containing a carboxylic acid or carboxylate group also includes those substituents wherein the carboxylic acid or carboxylate group is protected by its methyl ester, benzyl ester, tert-butyl ester, an ester of 2,6-disubstituted phenol (e.g. 2,6-dimethylphenol, 2,6-diisopropylphenol, 2,6-di-tert-butylphenol), a silyl ester, an orthoester, or an oxazoline.

By "functionalized" as in "functionalized hydrocarbyl," "functionalized alkyl," "functionalized olefin," "functionalized cyclic olefin," and the like, is meant that in the hydrocarbyl, alkyl, aryl, heteroaryl, olefin, cyclic olefin, or other moiety, at least one hydrogen atom bound to a carbon (or other) atom is replaced with one or more functional groups such as those described herein and above. The term "functional group" is meant to include any functional species that is suitable for the uses described herein. In particular, as used herein, a functional group would necessarily possess the ability to react with or bond to corresponding functional groups on a substrate surface.

In addition, the aforementioned functional groups may, if a particular group permits, be further substituted with one or more additional functional groups or with one or more hydrocarbyl moieties such as those specifically enumerated above. Analogously, the abovementioned hydrocarbyl moieties may be further substituted with one or more functional groups or additional hydrocarbyl moieties such as those specifically enumerated.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

In some embodiments, $L^2$ is phosphine, sulfonated phosphine, phosphite, phosphinite, phosphonite, arsine, stibine, ether, (including cyclic ethers), amine, amide, imine, sulfoxide, carboxyl, nitrosyl, pyridine, substituted pyridine, imidazole, substituted imidazole, pyrazine, substituted pyrazine or thioether. Exemplary ligands are trisubstituted phosphines. Preferred trisubstituted phosphines are of the formula $PR^{H1}R^{H2}R^{H3}$, where $R^{H1}$, $R^{H2}$, and $R^{H3}$ are each independently substituted or unsubstituted aryl or $C_1$-$C_{10}$ alkyl, particularly primary alkyl, secondary alkyl, or cycloalkyl. In other embodiments, $L^2$ is trimethylphosphine ($PMe_3$), triethylphosphine ($PEt_3$), tri-n-butylphosphine ($PBu_3$), tri(ortho-tolyl)phosphine (P-o-tolyl$_3$), tri-tert-butylphosphine (P-tert-Bu$_3$), tricyclopentylphosphine (PCyclopentyl$_3$), tricyclohexylphosphine (PCy$_3$), triisopropylphosphine (P-i-Pr$_3$), trioctylphosphine (POct$_3$), triisobutylphosphine, (P-i-Bu$_3$), triphenylphosphine (PPh$_3$), tri(pentafluorophenyl) phosphine (P(C$_6$F$_5$)$_3$), methyldiphenylphosphine (PMePh$_2$), dimethylphenylphosphine (PMe$_2$Ph), or diethylphenylphosphine (PEt$_2$Ph).

In other embodiments, $L^2$ and $L^3$ include, without limitation, heterocycles containing nitrogen, sulfur, oxygen, or a mixture thereof.

Examples of nitrogen-containing heterocycles appropriate for $L^2$ and $L^3$ include pyridine, bipyridine, pyridazine, pyrimidine, bipyridamine, pyrazine, 1,3,5-triazine, 1,2,4-triazine, 1,2,3-triazine, pyrrole, 2H-pyrrole, 3H-pyrrole, pyrazole, 2H-imidazole, 1,2,3-triazole, 1,2,4-triazole, indole, 3H-indole, 1H-isoindole, cyclopenta(b)pyridine, indazole, quinoline, bisquinoline, isoquinoline, bisisoquinoline, cinnoline, quinazoline, naphthyridine, piperidine, piperazine, pyrrolidine, pyrazolidine, quinuclidine, imidazolidine, picolylimine, purine, benzimidazole, bisimidazole, phenazine, acridine, and carbazole. Additionally, the nitrogen-containing heterocycles may be optionally substituted on a non-coordinating heteroatom with a non-hydrogen substitutent.

Examples of sulfur-containing heterocycles appropriate for $L^2$ and $L^3$ include thiophene, 1,2-dithiole, 1,3-dithiole, thiepin, benzo(b)thiophene, benzo(c)thiophene, thionaphthene, dibenzothiophene, 2H-thiopyran, 4H-thiopyran, and thioanthrene.

Examples of oxygen-containing heterocycles appropriate for $L^2$ and $L^3$ include 2H-pyran, 4H-pyran, 2-pyrone, 4-pyrone, 1,2-dioxin, 1,3-dioxin, oxepin, furan, 2H-1-benzopyran, coumarin, coumarone, chromene, chroman-4-one, isochromen-1-one, isochromen-3-one, xanthene, tetrahydrofuran, 1,4-dioxan, and dibenzofuran.

Examples of mixed heterocycles appropriate for $L^2$ and $L^3$ include isoxazole, oxazole, thiazole, isothiazole, 1,2,3-oxadiazole, 1,2,4-oxadiazole, 1,3,4-oxadiazole, 1,2,3,4-oxatriazole, 1,2,3,5-oxatriazole, 3H-1,2,3-dioxazole, 3H-1,2-oxathiole, 1,3-oxathiole, 4H-1,2-oxazine, 2H-1,3-oxazine, 1,4-oxazine, 1,2,5-oxathiazine, o-isooxazine, phenoxazine, phenothiazine, pyrano[3,4-b]pyrrole, indoxazine, benzoxazole, anthranil, and morpholine. Preferred $L^2$ and $L^3$ ligands are aromatic nitrogen-containing and oxygen-containing heterocycles, and particularly preferred $L^2$ and $L^3$ ligands are monocyclic N-heteroaryl ligands that are optionally substituted with 1 to 3, preferably 1 or 2, substituents. Specific examples of particularly preferred $L^2$ and $L^3$ ligands are pyridine and substituted pyridines, such as 3-bromopyridine, 4-bromopyridine, 3,5-dibromopyridine, 2,4,6-tribromopyridine, 2,6-dibromopyridine, 3-chloropyridine, 4-chloropyridine, 3,5-dichloropyridine, 2,4,6-trichloropyridine, 2,6-dichloropyridine, 4-iodopyridine, 3,5-diiodopyridine, 3,5-dibromo-4-methylpyridine, 3,5-dichloro-4-methylpyridine, 3,5-dimethyl-4-bromopyridine, 3,5-dimethylpyridine, 4-methylpyridine, 3,5-diisopropylpyridine, 2,4,6-trimethylpyridine, 2,4,6-triisopropylpyridine, 4-(tert-butyl)pyridine, 4-phenylpyridine, 3,5-diphenylpyridine, 3,5-dichloro-4-phenylpyridine, and the like.

In general, any substituents present on $L^2$ and/or $L^3$ are selected from halo, $C_1$-$C_{20}$ alkyl, substituted $C_1$-$C_{20}$ alkyl, $C_1$-$C_{20}$ heteroalkyl, substituted $C_1$-$C_{20}$ heteroalkyl, $C_5$-$C_{24}$ aryl, substituted $C_5$-$C_{24}$ aryl, $C_5$-$C_{24}$ heteroaryl, substituted $C_5$-$C_{24}$ heteroaryl, $C_6$-$C_{24}$ alkaryl, substituted $C_6$-$C_{24}$ alkaryl, $C_6$-$C_{24}$ heteroalkaryl, substituted $C_6$-$C_{24}$ heteroalkaryl, $C_6$-$C_{24}$ aralkyl, substituted $C_6$-$C_{24}$ aralkyl, $C_6$-$C_{24}$ heteroaralkyl, substituted $C_6$-$C_{24}$ heteroaralkyl, and functional groups, with suitable functional groups including, without limitation, $C_1$-$C_{20}$ alkoxy, $C_5$-$C_{24}$ aryloxy, $C_2$-$C_{20}$ alkylcarbonyl, $C_6$-$C_{24}$ arylcarbonyl, $C_2$-$C_{20}$ alkylcarbonyloxy, $C_6$-$C_{24}$ arylcarbonyloxy, $C_2$-$C_{20}$ alkoxycarbonyl, $C_6$-$C_{24}$ aryloxycarbonyl, halocarbonyl, $C_2$-$C_{20}$ alkylcarbonato, $C_6$-$C_{24}$ arylcarbonato, carboxy, carboxylato, carbamoyl, mono-($C_1$-$C_{20}$ alkyl)-substituted carbamoyl, di-($C_1$-$C_{20}$ alkyl)-substituted carbamoyl, di-N—($C_1$-$C_{20}$ alkyl), N—($C_5$-$C_{24}$ aryl)-substituted carbamoyl, mono-($C_5$-$C_{24}$ aryl)-substituted carbamoyl, di-($C_6$-$C_{24}$ aryl)-substituted carbamoyl, thiocarbamoyl, mono-($C_1$-$C_{20}$ alkyl)-substituted thiocarbamoyl, di-($C_1$-$C_{20}$ alkyl)-substituted thiocarbamoyl, di-N—($C_1$-$C_{20}$ alkyl)-N—($C_6$-$C_{24}$ aryl)-substituted thiocarbamoyl, mono-($C_6$-$C_{24}$ aryl)-substituted thiocarbamoyl, di-($C_6$-$C_{24}$ aryl)-substituted thiocarbamoyl, carbamido, formyl, thioformyl, amino, mono-($C_1$-$C_{20}$ alkyl)-substituted amino, di-($C_1$-$C_{20}$ alkyl)-substituted amino, mono-($C_5$-$C_{24}$ aryl)-substituted amino, di-($C_5$-$C_{24}$ aryl)-substituted amino, di-N—($C_1$-$C_{20}$ alkyl), N—($C_5$-$C_{24}$ aryl)-substituted amino, $C_2$-$C_{20}$ alkylamido, $C_6$-$C_{24}$ arylamido, imino, $C_1$-$C_{20}$ alkylimino, $C_5$-$C_{24}$ arylimino, nitro, and nitroso. In addition, two adjacent substituents may be taken together to form a ring, generally a five- or six-membered alicyclic or aryl ring, optionally containing 1 to 3 heteroatoms and 1 to 3 substituents as above.

Preferred substituents on $L^2$ and $L^3$ include, without limitation, halo, $C_1$-$C_{12}$ alkyl, substituted $C_1$-$C_{12}$ alkyl, $C_1$-$C_{12}$ heteroalkyl, substituted $C_1$-$C_{12}$ heteroalkyl, $C_5$-$C_{14}$ aryl, substituted $C_5$-$C_{14}$ aryl, $C_5$-$C_{14}$ heteroaryl, substituted $C_5$-$C_{14}$ heteroaryl, $C_6$-$C_{16}$ alkaryl, substituted $C_6$-$C_{16}$ alkaryl, $C_6$-$C_{16}$ heteroalkaryl, substituted $C_6$-$C_{16}$ heteroalkaryl, $C_6$-$C_{16}$ aralkyl, substituted $C_6$-$C_{16}$ aralkyl, $C_6$-$C_{16}$ heteroaralkyl, substituted $C_6$-$C_{16}$ heteroaralkyl, $C_1$-$C_{12}$ alkoxy, $C_5$-$C_{14}$ aryloxy, $C_2$-$C_{12}$ alkylcarbonyl, $C_6$-$C_{14}$ arylcarbonyl, $C_2$-$C_{12}$ alkylcarbonyloxy, $C_6$-$C_{14}$ arylcarbonyloxy, $C_2$-$C_{12}$ alkoxycarbonyl, $C_6$-$C_{14}$ aryloxycarbonyl, halocarbonyl, formyl, amino, mono-($C_1$-$C_{12}$ alkyl)-substituted amino, di-($C_1$-$C_{12}$ alkyl)-substituted amino, mono-($C_5$-$C_{14}$ aryl)-substituted amino, di-($C_5$-$C_{14}$ aryl)-substituted amino, and nitro.

Of the foregoing, the most preferred substituents are halo, $C_1$-$C_6$ alkyl, $C_1$-$C_6$ haloalkyl, $C_1$-$C_6$ alkoxy, phenyl, substituted phenyl, formyl, N,N-di($C_1$-$C_6$ alkyl)amino, nitro, and nitrogen heterocycles as described above (including, for example, pyrrolidine, piperidine, piperazine, pyrazine, pyrimidine, pyridine, pyridazine, etc.).

In certain embodiments, $L^2$ and $L^3$ may also be taken together to form a bidentate or multidentate ligand containing two or more, generally two, coordinating heteroatoms such as N, O, S, or P, with preferred such ligands being diimine ligands of the Brookhart type. One representative bidentate ligand has the structure of formula (VI)

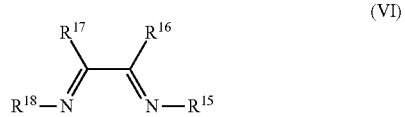

(VI)

wherein $R^{15}$, $R^{16}$, $R^{17}$, and $R^{18}$ hydrocarbyl (e.g., $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, or $C_6$-$C_{24}$ aralkyl), substituted hydrocarbyl (e.g., substituted $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, or $C_6$-$C_{24}$ aralkyl), heteroatom-containing hydrocarbyl (e.g., $C_1$-$C_{20}$ heteroalkyl, $C_5$-$C_{24}$ heteroaryl, heteroatom-containing $C_6$-$C_{24}$ aralkyl, or heteroatom-containing $C_6$-$C_{24}$ alkaryl), or substituted heteroatom-containing hydrocarbyl (e.g., substituted $C_1$-$C_{20}$ heteroalkyl, $C_5$-$C_{24}$ heteroaryl, heteroatom-containing $C_6$-$C_{24}$ aralkyl, or heteroatom-containing $C_6$-$C_{24}$ alkaryl), or (1) $R^{15}$ and $R^{16}$, (2) $R^{17}$ and $R^{18}$, (3) $R^{16}$ and $R^{17}$, or (4) both $R^{15}$ and $R^{16}$, and $R^{17}$ and $R^{18}$, may be taken together to form a ring, i.e., an N-heterocycle. Preferred cyclic groups in such a case are five- and six-membered rings, typically aromatic rings.

$X^1$ and $X^2$ are anionic ligands, and may be the same or different, or are linked together to form a cyclic group, typically although not necessarily a five- to eight-membered ring. In preferred embodiments, $X^1$ and $X^2$ are each independently hydrogen, halide, or one of the following groups: $C_1$-$C_{20}$ alkyl, $C_5$-$C_{24}$ aryl, $C_1$-$C_{20}$ alkoxy, $C_5$-$C_{24}$ aryloxy, $C_2$-$C_{20}$ alkoxycarbonyl, $C_6$-$C_{24}$ aryloxycarbonyl, $C_2$-$C_{24}$ acyl, $C_2$-$C_{24}$ acyloxy, $C_1$-$C_{20}$ alkylsulfonato, $C_5$-$C_{24}$ arylsulfonato, $C_1$-$C_{20}$ alkylsulfanyl, $C_5$-$C_{24}$ arylsulfanyl, $C_1$-$C_{20}$ alkylsulfinyl, $NO_3$, —N=C=O, —N=C=S, or $C_5$-$C_{24}$ arylsulfinyl. Optionally, $X^1$ and $X^2$ may be substituted with one or more moieties selected from $C_1$-$C_{12}$ alkyl, $C_1$-$C_{12}$ alkoxy, $C_5$-$C_{24}$ aryl, and halide, which may, in turn, with the exception of halide, be further substituted with one or more groups selected from halide, $C_1$-$C_6$ alkyl, $C_1$-$C_6$ alkoxy, and phenyl.

In more preferred embodiments, $X^1$ and $X^2$ are halide, benzoate, $C_2$-$C_6$ acyl, $C_2$-$C_6$ alkoxycarbonyl, $C_1$-$C_6$ alkyl, phenoxy, $C_1$-$C_6$ alkoxy, $C_1$-$C_6$ alkylsulfanyl, aryl, or $C_1$-$C_6$ alkylsulfonyl. In even more preferred embodiments, $X^1$ and $X^2$ are each halide, $CF_3CO_2$, $CH_3CO_2$, $CFH_2CO_2$, $(CH_3)_3CO$, $(CF_3)_2(CH_3)CO$, $(CF_3)(CH_3)_2CO$, PhO, MeO, EtO, tosylate, mesylate, or trifluoromethane-sulfonate. In the most preferred embodiments, $X^1$ and $X^2$ are each chloride.

$R^1$ and $R^2$ are independently selected from hydrogen, hydrocarbyl (e.g., $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), substituted hydrocarbyl (e.g., substituted $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), heteroatom-containing hydrocarbyl (e.g., heteroatom-containing $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), and substituted heteroatom-containing hydrocarbyl (e.g., substituted heteroatom-containing $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), and functional groups. $R^1$ and $R^2$ may also be linked to form a cyclic group, which may be aliphatic or aromatic, and may contain substituents and/or heteroatoms. Generally, such a cyclic group will contain 4 to 12, preferably 5, 6, 7, or 8 ring atoms. In certain embodiments, $R^2$ is not hydrogen.

In some embodiments, $R^1$ is hydrogen and $R^2$ is selected from $C_1$-$C_{20}$ alkyl, $C_2$-$C_{20}$ alkenyl, and $C_5$-$C_{24}$ aryl, more preferably $C_1$-$C_6$ alkyl, $C_2$-$C_6$ alkenyl, and $C_5$-$C_{14}$ aryl. Still more preferably, $R^2$ is phenyl, methyl, ethyl, isopropyl, or t-butyl, optionally substituted with one or more moieties selected from $C_1$-$C_6$ alkyl, $C_1$-$C_6$ alkoxy, phenyl, and a functional group Fn as defined earlier herein. Most preferably, $R^2$ is phenyl or ethyl optionally substituted with one or more moieties selected from methyl, ethyl, chloro, bromo, iodo, fluoro, nitro, dimethylamino, methyl, methoxy, and phenyl. Optimally, $R^2$ is phenyl or ethyl.

Any two or more (typically two, three, or four) of $X^1$, $X^2$, $L^2$, $L^3$, $R^1$, and $R^2$ can be taken together to form a cyclic group, including bidentate or multidentate ligands, as disclosed, for example, in U.S. Pat. No. 5,312,940, the disclosure of which is incorporated herein by reference. When any of $X^1$, $X^2$, $L^2$, $L^3$, $R^1$, and $R^2$ are linked to form cyclic groups, those cyclic groups may contain 4 to 12, preferably 4, 5, 6, 7 or 8 atoms, or may comprise two or three of such rings, which may be either fused or linked. The cyclic groups may be aliphatic or aromatic, and may be heteroatom-containing and/or substituted. The cyclic group may, in some cases, form a bidentate ligand or a tridentate ligand. Examples of bidentate ligands include, but are not limited to, bisphosphines, dialkoxides, alkyldiketonates, and aryldiketonates.

In some embodiments, $R^3$ and $R^4$ are as defined above, with preferably at least one of $R^3$ and $R^4$, and more preferably both $R^3$ and $R^4$, being alicyclic or aromatic of one to about five rings, and optionally containing one or more heteroatoms and/or substituents. Q is a linker, typically a hydrocarbylene linker, including substituted hydrocarbylene, heteroatom-containing hydrocarbylene, and substituted heteroatom-containing hydrocarbylene linkers, wherein two or more substituents on adjacent atoms within Q may also be linked to form an additional cyclic structure, which may be similarly substituted to provide a fused polycyclic structure of two to about five cyclic groups. Q is often, although not necessarily, a two-atom linkage or a three-atom linkage.

Examples of N-heterocyclic carbene (NHC) ligands and acyclic diaminocarbene ligands include, but are not limited to, the following where DIPP or DiPP is diisopropylphenyl and Mes is 2,4,6-trimethylphenyl:

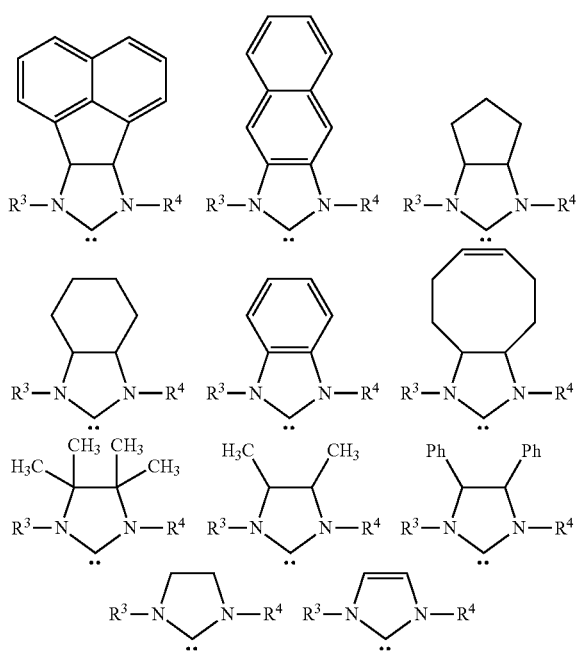

Additional examples of N-heterocyclic carbene (NHC) ligands and acyclic diaminocarbene ligands suitable as $L^1$ thus include, but are not limited to the following:

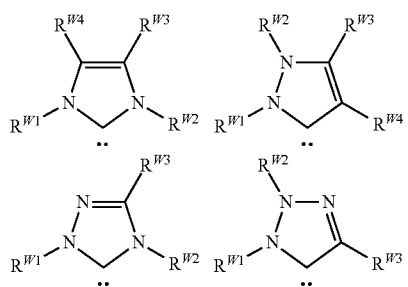

wherein $R^{W1}$, $R^{W2}$, $R^{W3}$, $R^{W4}$ are independently hydrogen, unsubstituted hydrocarbyl, substituted hydrocarbyl, or heteroatom containing hydrocarbyl, and where one or both of $R^{W3}$ and $R^{W4}$ may be in independently selected from halogen, nitro, amido, carboxyl, alkoxy, aryloxy, sulfonyl, carbonyl, thio, or nitroso groups.

Additional examples of suitable N-heterocyclic carbene (NHC) ligands are further described in U.S. Pat. Nos. 7,378,528; 7,652,145; 7,294,717; 6,787,620; 6,635,768; and 6,552,139 the contents of each are incorporated herein by reference.

In a more preferred embodiment, Q is a two-atom linkage having the structure $-CR^{11}R^{12}-CR^{13}R^{14}-$ or $-CR^{11}=CR^{13}-$, preferably $-CR^{11}R^{12}-CR^{13}R^{14}-$, wherein $R^{11}$, $R^{12}$, $R^{13}$, and $R^{14}$ are independently selected from hydrogen, hydrocarbyl, substituted hydrocarbyl, heteroatom-containing hydrocarbyl, substituted heteroatom-containing hydrocarbyl, and functional groups. Examples of functional groups here include without limitation carboxyl, $C_1$-$C_{20}$ alkoxy, $C_5$-$C_{24}$ aryloxy, $C_2$-$C_{20}$ alkoxycarbonyl, $C_5$-$C_{24}$ alkoxycarbonyl, $C_2$-$C_{24}$ acyloxy, $C_1$-$C_{20}$ alkylthio, $C_5$-$C_{24}$ arylthio, $C_1$-$C_{20}$ alkylsulfonyl, and $C_1$-$C_{20}$ alkylsulfinyl, optionally substituted with one or more moieties selected from $C_1$-$C_{12}$ alkyl, $C_1$-$C_{12}$ alkoxy, $C_5$-$C_{14}$ aryl, hydroxyl, sulfhydryl, formyl, and halide. $R^{11}$, $R^{12}$, $R^{13}$, and $R^{14}$ are preferably independently selected from hydrogen, $C_1$-$C_{12}$ alkyl, substituted $C_1$-$C_{12}$ alkyl, $C_1$-$C_{12}$ heteroalkyl, substituted $C_1$-$C_{12}$ heteroalkyl, phenyl, and substituted phenyl. Alternatively, any two of $R^{11}$, $R^{12}$, $R^{13}$, and $R^{14}$ may be linked together to form a substituted or unsubstituted, saturated or unsaturated ring structure, e.g., a $C_4$-$C_{12}$ alicyclic group or a $C_5$ or $C_6$ aryl group, which may itself be substituted, e.g., with linked or fused alicyclic or aromatic groups, or with other substituents. In one further aspect, any one or more of $R^{11}$, $R^{12}$, $R^{13}$, and $R^{14}$ comprises one or more of the linkers. Additionally, $R^3$ and $R^4$ may be unsubstituted phenyl or phenyl substituted with one or more substituents selected from $C_1$-$C_{20}$ alkyl, substituted $C_1$-$C_{20}$ alkyl, $C_1$-$C_{20}$ heteroalkyl, substituted $C_1$-$C_{20}$ heteroalkyl, $C_5$-$C_{24}$ aryl, substituted $C_5$-$C_{24}$ aryl, $C_5$-$C_{24}$ heteroaryl, $C_6$-$C_{24}$ aralkyl, $C_6$-$C_{24}$ alkaryl, or halide. Furthermore, $X^1$ and $X^2$ may be halogen.

When $R^3$ and $R^4$ are aromatic, they are typically although not necessarily composed of one or two aromatic rings, which may or may not be substituted, e.g., $R^3$ and $R^4$ may be phenyl, substituted phenyl, biphenyl, substituted biphenyl, or the like. In one preferred embodiment, $R^3$ and $R^4$ are the same and are each unsubstituted phenyl or phenyl substituted with up to three substituents selected from $C_1$-$C_{20}$ alkyl, substituted $C_1$-$C_{20}$ alkyl, $C_1$-$C_{20}$ heteroalkyl, substituted $C_1$-$C_{20}$ heteroalkyl, $C_5$-$C_{24}$ aryl, substituted $C_5$-$C_{24}$ aryl, $C_5$-$C_{24}$ heteroaryl, $C_6$-$C_{24}$ aralkyl, $C_6$-$C_{24}$ alkaryl, or halide. Preferably, any substituents present are hydrogen, $C_1$-$C_{12}$ alkyl, $C_1$-$C_{12}$ alkoxy, $C_5$-$C_{14}$ aryl, substituted $C_5$-$C_{14}$ aryl, or halide. As an example, $R^3$ and $R^4$ are mesityl (i.e. Mes as defined herein).

In certain preferred embodiments, $Ru=C(R^1)(Y-R^2)$ moiety is a substituted vinyl ether carbine or vinyl amine carbene. In other embodiments, $R^2$ is $C_{1-6}$ alkyl, preferably ethyl or butyl. In still other embodiments, Q is $-CH_2-CH_2-$ and $R^3$ and $R^4$ are mesityl. The catalytic precursors may also have a structure shown below, as applied and exemplified in the Examples

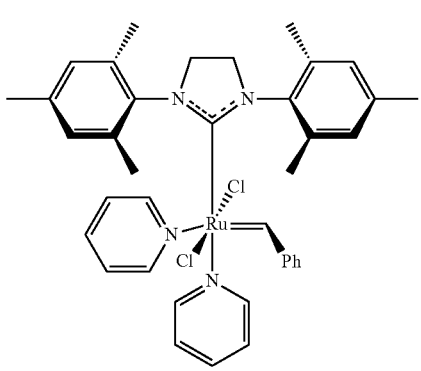

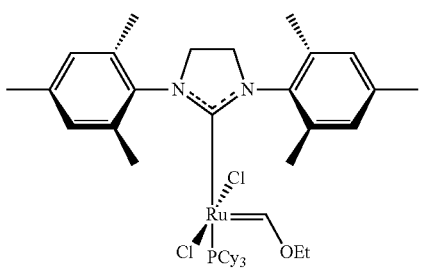

Photochemical Conditions

As used herein, and unless otherwise stated, the term "activates" refers to the fact that the irradiated catalyst metathesizes olefins or alkynes at a rate that is faster at least 10 times faster than metathesizes the same olefins or alkynes before irradiation. Having said this, and when so specified, independent embodiments provide that the irradiated catalyst metathesizes olefins or alkynes at a rate that is faster at least 2 times, 5 times, 50 times, 100 times, or 1000 times faster than metathesizes the same olefins or alkynes before irradiation.

It is not clear as to the detailed mechanism by which light activates the Fischer-type carbene catalysts, but it appears that the wavelength of irradiation is important. In certain embodiments, the Fischer-type carbene catalyst (at least for the Fischer-type carbene ruthenium catalyst) is irradiated with light comprising a wavelength in a range of from about 220 to about 440 nm, preferably in a range of from about 240 to about 260 nm, or from about 260 nm to about 340 nm, or from about 340 to about 360 nm, or a combination thereof. In other preferred embodiments, this wavelength is in a range of from about 240 to about 260 nm or from about 340 to about 360 nm. This is consistent with currently available dry-polymer photopolymers used in the printed circuit industry (e.g. photoresist and soldermask) function when exposed to ultraviolet (UV) radiation in the range of about 300 nm to about 440 nm in a production environment.

Similarly, these Fischer-type carbene catalysts, including the Fischer-type carbene ruthenium catalysts, become activated after being irradiated with a light having an intensity in a range of about 2 watts to about 6000 watts, preferably in a range of from about 2 watts to about 10 watts, at at least one wavelength in a range of about 220 to 440 nm. Small UV lamps are typically commercially available in range of from about 6 to about 40 watts and the catalysts described herein have been demonstrated to respond well (i.e., become activated) at these levels (see Examples). Larger UV lamps start at about 1000 watts, and commercial exposure equipment routinely provides as much as 6000 watts of irradiation from banks of high-pressure mercury arc-lamps. It is expected that the catalysts described herein will work at these levels, if necessary to go there.

Unsaturated Precursors

The methods of the present invention also consider that the Fischer-type carbene catalyst, including the Fischer-type carbene ruthenium catalyst, as described herein, may be dissolved in a solvent in the presence of at least one unsaturated organic precursor or are admixed or dissolved in at least one unsaturated organic precursor. As used herein, the term "at least one unsaturated organic precursor" is intended to connote one or more molecular compound or oligomer, or combination thereof, each comprising at least one olefinic (alkene) or one acetylenic (alkyne) bond per molecule or oligomeric unit. These precursors comprise cyclic or alicyclic cis- or trans-olefins or cyclic or alicyclic acetylenes, or a structure having both types of bonds (i.e., alicyclic or cyclic enynes).

As used herein, the term "alkynyl" (or "acetylenic") or "alkyne" refers to a linear or branched hydrocarbon group or compound of 2 to about 24 carbon atoms containing at least one triple bond, such as ethynyl, n-propynyl, and the like. Preferred alkynyl groups herein contain 2 to about 12 carbon atoms, preferably containing a terminal alkyne bond. The term "lower alkynyl" refers to an alkynyl group of 2 to 6 carbon atoms. The term "substituted alkynyl" refers to alkynyl substituted with one or more substituent groups. As used herein, the terms "optional" or "optionally" mean that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

Olefinic precursors may be used in tandem with the alkynes, either employed as part of the feedstock mixtures, or in sequential processing of the product polymers. Suitable options for such precursors are those ring systems, particularly strained ring systems, which are useful for ROMP reactions. One such class of compounds in this regard is substituted or unsubstituted cyclooctatetraenes, including cyclooctatetraene itself. However, a polymer or polymer block derived from this material would be a polyacetylene, and this moiety is preferably derived in this invention from acetylene itself. Because cyclooctatetraene is made from acetylene, use of this latter precursor by an enyne reaction offers a more direct, efficient and economical synthesis. The ability to operate at the solid/gas interface for the surface confined polymerization of polyacetylene enables direct control over the pressure and temperature of the system.

As described above, suitable options for such olefinic or acetylenic precursors include ring systems, particularly strained ring systems, which are useful for ROMP reactions. Such cyclic olefins may be optionally substituted, optionally heteroatom-containing, mono-unsaturated, di-unsaturated, or poly-unsaturated $C_5$ to $C_{24}$ hydrocarbons that may be mono-, di-, or poly-cyclic. The cyclic olefin may generally be any strained or unstrained cyclic olefin, provided the cyclic olefin is able to participate in a ROMP reaction either individually or as part of a ROMP cyclic olefin composition. While certain unstrained cyclic olefins such as cyclohexene are generally understood to not undergo ROMP reactions by themselves, under appropriate circumstances, such unstrained cyclic olefins may nonetheless be ROMP active. For example, when present as a co-monomer in a ROMP composition, unstrained cyclic olefins may be ROMP active. Accordingly, as used herein and as would be appreciated by the skilled artisan, the term "unstrained cyclic olefin" is intended to refer to those unstrained cyclic olefins that may undergo a ROMP reaction under any conditions, or in any ROMP composition, provided the unstrained cyclic olefin is ROMP active.

In general, the cyclic olefin may be represented by the structure of formula (A)

(A)

wherein J, $R^{41}$, and $R^{42}$ are as follows:

$R^{41}$ and $R^{42}$ is selected independently from the group consisting of hydrogen, hydrocarbyl (e.g., $C_1$-$C_{20}$ alkyl, $C_5$-$C_{20}$ aryl, $C_5$-$C_{30}$ aralkyl, or $C_5$-$C_{30}$ alkaryl), substituted hydrocarbyl (e.g., substituted $C_1$-$C_{20}$ alkyl, $C_5$-$C_{20}$ aryl, $C_5$-$C_{30}$ aralkyl, or $C_5$-$C_{30}$ alkaryl), heteroatom-containing hydrocarbyl (e.g., $C_1$-$C_{20}$ heteroalkyl, $C_5$-$C_{20}$ heteroaryl, heteroatom-containing $C_5$-$C_{30}$ aralkyl, or heteroatom-containing $C_5$-$C_{30}$ alkaryl), and substituted heteroatom-containing hydrocarbyl (e.g., substituted $C_1$-$C_{20}$ heteroalkyl, $C_5$-$C_{20}$ heteroaryl, heteroatom-containing $C_5$-$C_{30}$ aralkyl, or heteroatom-containing $C_5$-$C_{30}$ alkaryl) and, if substituted hydrocarbyl or substituted heteroatom-containing hydrocarbyl, wherein the substituents may be functional groups ("Fn") such as alkene, alkyne, phosphonato, phosphoryl, phosphanyl, phosphino, sulfonato, $C_1$-$C_{20}$ alkylsulfanyl, $C_5$-$C_{20}$ arylsulfanyl, $C_1$-$C_{20}$ alkylsulfonyl, $C_5$-$C_{20}$ arylsulfonyl, $C_1$-$C_{20}$ alkylsulfinyl, $C_5$-$C_{20}$ arylsulfinyl, sulfonamido, amino, amido, imino, nitro, nitroso, hydroxyl, $C_1$-$C_{20}$ alkoxy, $C_5$-$C_{20}$ aryloxy, $C_2$-$C_{20}$ alkoxycarbonyl, $C_5$-$C_{20}$ aryloxycarbonyl, carboxyl, carboxylato, mercapto, formyl, $C_1$-$C_{20}$ thioester, cyano, cyanato, thiocyanato, isocyanate, thioisocyanate, carbamoyl, epoxy, styrenyl, silyl, silyloxy, silanyl, siloxazanyl, boronato, boryl, or halogen, or a metal-containing or metalloid-containing group (wherein the metal may be, for example, Sn or Ge). $R^{A1}$ and $R^{A2}$ may itself be one of the aforementioned groups, such that the Fn moiety is directly bound to the olefinic carbon atom indicated in the structure. In the latter case, however, the functional group will generally not be directly bound to the olefinic carbon through a heteroatom containing one or more lone pairs of electrons, e.g., an oxygen, sulfur, nitrogen, or phosphorus atom, or through an electron-rich metal or metalloid such as Ge, Sn, As, Sb, Se, Te, etc. With such functional groups, there will normally be an intervening linkage $Z^*$, such that $R^{A1}$ and/or $R^{A2}$ then has the structure —$(Z^*)_n$—Fn wherein n is 1, Fn is the functional group, and $Z^*$ is a hydrocarbylene linking group such as an alkylene, substituted alkylene, heteroalkylene, substituted heteroalkene, arylene, substituted arylene, heteroarylene, or substituted heteroarylene linkage.

J is a saturated or unsaturated hydrocarbylene, substituted hydrocarbylene, heteroatom-containing hydrocarbylene, or substituted heteroatom-containing hydrocarbylene linkage, wherein when J is substituted hydrocarbylene or substituted heteroatom-containing hydrocarbylene, the substituents may include one or more —$(Z^*)_n$—Fn groups, wherein n is zero or 1, and Fn and $Z^*$ are as defined previously. Additionally, two or more substituents attached to ring carbon (or other) atoms within J may be linked to form a bicyclic or polycyclic olefin. J will generally contain in the range of approximately 5 to 14 ring atoms, typically 5 to 8 ring atoms, for a monocyclic olefin, and, for bicyclic and polycyclic olefins, each ring will generally contain 4 to 8, typically 5 to 7, ring atoms.

Mono-unsaturated cyclic olefins encompassed by structure (A) may be represented by the structure (B)

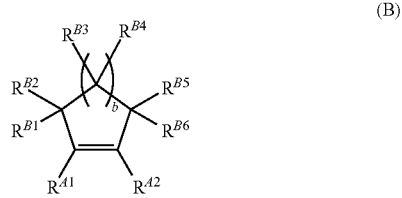

(B)

wherein b is an integer generally although not necessarily in the range of 1 to 10, typically 1 to 5, $R^{A1}$ and $R^{A2}$ are as defined above for structure (A), and $R^{B1}$, $R^{B2}$, $R^{B3}$, $R^{B4}$, $R^{B5}$, and $R^{B6}$ are independently selected from the group consisting of hydrogen, hydrocarbyl, substituted hydrocarbyl, heteroatom-containing hydrocarbyl, substituted heteroatom-containing hydrocarbyl and —$(Z^*)_n$—Fn where n, $Z^*$ and Fn are as defined previously, and wherein if any of the $R^{B1}$ through $R^{B6}$ moieties is substituted hydrocarbyl or substituted heteroatom-containing hydrocarbyl, the substituents may include one or more —$(Z^*)_n$—Fn groups. Accordingly, $R^{B1}$, $R^{B2}$, $R^{B3}$, $R^{B4}$, $R^{B5}$, and $R^{B6}$ may be, for example, hydrogen, hydroxyl, $C_1$-$C_{20}$ alkyl, $C_5$-$C_{20}$ aryl, $C_1$-$C_{20}$ alkoxy, $C_5$-$C_{20}$ aryloxy, $C_2$-$C_{20}$ alkoxycarbonyl, $C_5$-$C_{20}$ aryloxycarbonyl, amino, amido, nitro, etc.

Furthermore, any of the $R^{B1}$, $R^{B2}$, $R^{B3}$, $R^{B4}$, $R^{B5}$, and $R^{B6}$ moieties can be linked to any of the other $R^{B1}$, $R^{B2}$, $R^{B3}$, $R^{B4}$, $R^{B5}$, and $R^{B6}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The alicyclic group can be monocyclic, bicyclic, or polycyclic. When unsaturated the cyclic group can contain monounsaturation or multiunsaturation, with monounsaturated cyclic groups being preferred. When substituted, the rings contain monosubstitution or multisubstitution wherein the substituents are independently selected from hydrogen, hydrocarbyl, substituted hydrocarbyl, heteroatom-containing hydrocarbyl, substituted heteroatom-containing hydrocarbyl, —$(Z^*)_n$—Fn where n is zero or 1, $Z^*$ and Fn are as defined previously, and functional groups (Fn) provided above.

Examples of monounsaturated, monocyclic olefins encompassed by structure (B) include, without limitation, cyclopentene, cyclohexene, cycloheptene, cyclooctene, cyclononene, cyclodecene, cycloundecene, cyclododecene, tricyclodecene, tetracyclodecene, octacyclodecene, and cycloeicosene, and substituted versions thereof such as 1-methylcyclopentene, 1-ethylcyclopentene, 1-isopropylcyclohexene, 1-chloropentene, 1-fluorocyclopentene, 4-methylcyclopentene, 4-methoxy-cyclopentene, 4-ethoxy-cyclopentene, cyclopent-3-ene-thiol, cyclopent-3-ene, 4-methylsulfanyl-cyclopentene, 3-methylcyclohexene, 1-methylcyclooctene, 1,5-dimethylcyclooctene, etc.

Monocyclic diene reactants encompassed by structure (A) may be generally represented by the structure (C)

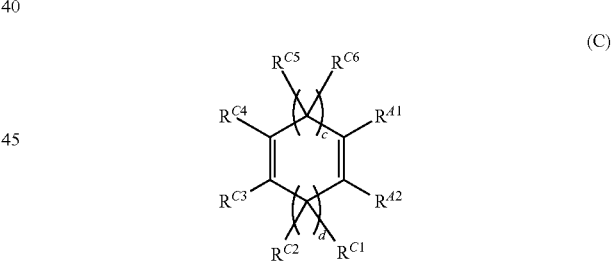

(C)

wherein c and d are independently integers in the range of 1 to about 8, typically 2 to 4, preferably 2 (such that the reactant is a cyclooctadiene), $R^{A1}$ and $R^{A2}$ are as defined above for structure (A), and $R^{C1}$, $R^{C2}$, $R^{C3}$, $R^{C4}$, $R^{C5}$, and $R^{C6}$ are defined as for $R^{B1}$ through $R^{B6}$. In this case, it is preferred that $R^{C3}$ and $R^{C4}$ be non-hydrogen substituents, in which case the second olefinic moiety is tetrasubstituted. Examples of monocyclic diene reactants include, without limitation, 1,3-cyclopentadiene, 1,3-cyclohexadiene, 1,4-cyclohexadiene, 5-ethyl-1,3-cyclohexadiene, 1,3-cycloheptadiene, cyclohexadiene, 1,5-cyclooctadiene, 1,3-cyclooctadiene, and substituted analogs thereof. Triene reactants are analogous to the diene structure (C), and will generally contain at least one methylene linkage between any two olefinic segments. Bicyclic and polycyclic olefins encompassed by structure (A) may be generally represented by the structure (D)

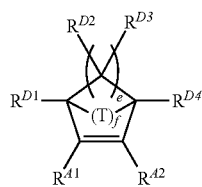

(D)

wherein $R^{A1}$ and $R^{A2}$ are as defined above for structure (A), $R^{D1}$, $R^{D2}$, $R^{D3}$, and $R^{D4}$ are as defined for $R^{B1}$ through $R^{B6}$, e is an integer in the range of 1 to 8 (typically 2 to 4) f is generally 1 or 2; T is lower alkylene or alkenylene (generally substituted or unsubstituted methyl or ethyl), CHR$^{G1}$, C(R$^{G1}$)$_2$, O, S, N—R$^{G1}$, P—R$^{G1}$, O=P—R$^{G1}$, Si(R$^{G1}$)$_2$, B—R$^{G1}$, or As—R$^{G1}$ where R$^{G1}$ is alkyl, alkenyl, cycloalkyl, cycloalkenyl, aryl, alkaryl, aralkyl, or alkoxy. Furthermore, any of the R$^{D1}$, R$^{D2}$, R$^{D3}$, and R$^{D4}$ moieties can be linked to any of the other R$^{D1}$, R$^{D2}$, R$^{D3}$, and R$^{D4}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The cyclic group can be monocyclic, bicyclic, or polycyclic. When unsaturated the cyclic group can contain mono-unsaturation or multi-unsaturation, with mono-unsaturated cyclic groups being preferred. When substituted, the rings contain mono-substitution or multi-substitution wherein the substituents are independently selected from hydrogen, hydrocarbyl, substituted hydrocarbyl, heteroatom-containing hydrocarbyl, substituted heteroatom-containing hydrocarbyl, —(Z*)$_n$—Fn where n is zero or 1, Z* and Fn are as defined previously, and functional groups (Fn) provided above.

Cyclic olefins encompassed by structure (D) are in the norbornene family. As used herein, norbornene means any compound that includes at least one norbornene or substituted norbornene moiety, including without limitation norbornene, substituted norbornene(s), norbornadiene, substituted norbornadiene(s), polycyclic norbornenes, and substituted polycyclic norbornene(s). Norbornenes within this group may be generally represented by the structure (E)

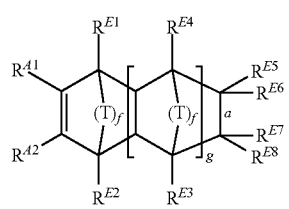

(E)

wherein $R^{A1}$ and $R^{A2}$ are as defined above for structure (A), T is as defined above for structure (D), $R^{E1}$, $R^{E2}$, $R^{E3}$, $R^{E4}$, $R^{E5}$, $R^{E6}$, $R^{E7}$ and $R^{E8}$ are as defined for $R^{B1}$ through $R^{B6}$, and "a" represents a single bond or a double bond, f is generally 1 or 2, "g" is an integer from 0 to 5, and when "a" is a double bond one of $R^{E5}$, $R^{E6}$ and one of $R^{E7}$, $R^{E8}$ is not present. Furthermore, any of the $R^{E5}$, $R^{E6}$, $R^{E7}$, and $R^{E8}$ moieties can be linked to any of the other $R^{E5}$, $R^{E6}$, $R^{E7}$, and $R^{E8}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The cyclic group can be monocyclic, bicyclic, or polycyclic. When unsaturated the cyclic group can contain monounsaturation or multiunsaturation, with monounsaturated cyclic groups being preferred. When substituted, the rings contain monosubstitution or multisubstitution wherein the substituents are independently selected from hydrogen, hydrocarbyl, substituted hydrocarbyl, heteroatom-containing hydrocarbyl, substituted heteroatom-containing hydrocarbyl, —(Z*)$_n$—Fn where n is zero or 1, Z* and Fn are as defined previously, and functional groups (Fn) provided above.

More preferred cyclic olefins possessing at least one norbornene moiety have the structure (F):

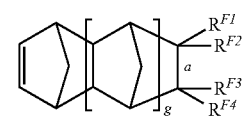

(F)

wherein, $R^{F1}$, $R^{F2}$, $R^{F3}$, and $R^{F4}$, are as defined for $R^{B1}$ through $R^{B6}$, and "a" represents a single bond or a double bond, "g" is an integer from 0 to 5, and when "a" is a double bond one of $R^{F1}$, $R^{F2}$ and one of $R^{F3}$, $R^{F4}$ is not present.

Furthermore, any of the $R^{F1}$, $R^{F2}$, $R^{F3}$, and $R^{F4}$ moieties can be linked to any of the other $R^{F1}$, $R^{F2}$, $R^{F3}$, and $R^{F4}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The alicyclic group can be monocyclic, bicyclic, or polycyclic. When unsaturated the cyclic group can contain monounsaturation or multiunsaturation, with monounsaturated cyclic groups being preferred. When substituted, the rings contain monosubstitution or multisubstitution wherein the substituents are independently selected from hydrogen, hydrocarbyl, substituted hydrocarbyl, heteroatom-containing hydrocarbyl, substituted heteroatom-containing hydrocarbyl, —(Z*)$_n$—Fn where n is zero or 1, Z* and Fn are as defined previously, and functional groups (Fn) provided above.

One route for the preparation of hydrocarbyl substituted and functionally substituted norbornenes employs the Diels-Alder cycloaddition reaction in which cyclopentadiene or substituted cyclopentadiene is reacted with a suitable dienophile at elevated temperatures to form the substituted norbornene adduct generally shown by the following reaction Scheme 1:

SCHEME 1

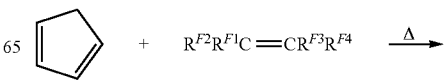

-continued

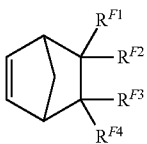

wherein $R^{F1}$ to $R^{F4}$ are as previously defined for structure (F).

Other norbornene adducts can be prepared by the thermal pyrolysis of dicyclopentadiene in the presence of a suitable dienophile. The reaction proceeds by the initial pyrolysis of dicyclopentadiene to cyclopentadiene followed by the Diels-Alder cycloaddition of cyclopentadiene and the dienophile to give the adduct shown below in Scheme 2:

SCHEME 2

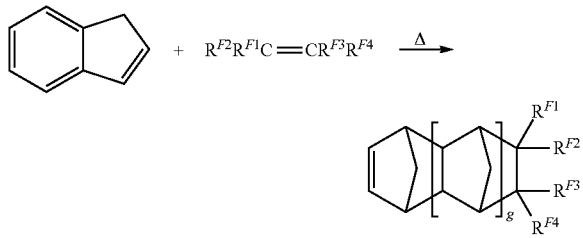

wherein "g" is an integer from 0 to 5, and $R^{F1}$ to $R^{F4}$ are as previously defined for structure (F).

Norbornadiene and higher Diels-Alder adducts thereof similarly can be prepared by the thermal reaction of cyclopentadiene and dicyclopentadiene in the presence of an acetylenic reactant as shown below in Scheme 3:

SCHEME 3

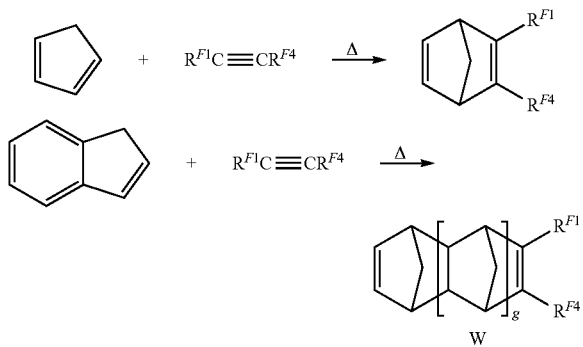

herein "g" is an integer from 0 to 5, $R^{F1}$ and $R^{F4}$ are as previously defined for structure (F) Examples of bicyclic and polycyclic olefins thus include, without limitation, dicyclopentadiene (DCPD); trimer and other higher order oligomers of cyclopentadiene including without limitation tricyclopentadiene (cyclopentadiene trimer), cyclopentadiene tetramer, and cyclopentadiene pentamer; ethylidenenorbornene; dicyclohexadiene; norbornene; 5-methyl-2-norbornene; 5-ethyl-2-norbornene; 5-isobutyl-2-norbornene; 5,6-dimethyl-2-norbornene; 5-phenylnorbornene; 5-benzylnorbornene; 5-acetylnorbornene; 5-methoxycarbonylnorbornene; 5-ethyoxycarbonyl-1-norbornene; 5-methyl-5-methoxy-carbonylnorbornene; 5-cyanonorbornene; 5,5,6-trimethyl-2-norbornene; cyclo-hexenylnorbornene; endo, exo-5,6-dimethoxynorbornene; endo, endo-5,6-dimethoxynorbornene; endo, exo-5,6-dimethoxycarbonylnorbornene; endo,endo-5,6-dimethoxycarbonylnorbornene; 2,3-dimethoxynorbornene; norbornadiene; tricycloundecene; tetracyclododecene; 8-methyltetracyclododecene; 8-ethyltetracyclododecene; 8-methoxycarbonyltetracyclododecene; 8-methyl-8-tetracyclododecene; 8-cyanotetracyclododecene; pentacyclopentadecene; pentacyclohexadecene; and the like, and their structural isomers, stereoisomers, and mixtures thereof. Additional examples of bicyclic and polycyclic olefins include, without limitation, $C_2$-$C_{12}$ hydrocarbyl substituted norbornenes such as 5-butyl-2-norbornene, 5-hexyl-2-norbornene, 5-octyl-2-norbornene, 5-decyl-2-norbornene, 5-dodecyl-2-norbornene, 5-vinyl-2-norbornene, 5-ethylidene-2-norbornene, 5-isopropenyl-2-norbornene, 5-propenyl-2-norbornene, and 5-butenyl-2-norbornene, and the like.

Preferred cyclic olefins include $C_5$ to $C_{24}$ unsaturated hydrocarbons. Also preferred are $C_5$ to $C_{24}$ cyclic hydrocarbons that contain one or more (typically 2 to 12) heteroatoms such as O, N, S, or P. For example, crown ether cyclic olefins may include numerous 0 heteroatoms throughout the cycle, and these are within the scope of the invention. In addition, preferred cyclic olefins are $C_5$ to $C_{24}$ hydrocarbons that contain one or more (typically 2 or 3) olefins. For example, the cyclic olefin may be mono-, di-, or tri-unsaturated. Examples of cyclic olefins include without limitation cyclooctene, cyclododecene, and (c,t,t)-1,5,9-cyclododecatriene.

The cyclic olefins may also comprise multiple (typically 2 or 3) rings. For example, the cyclic olefin may be mono-, di-, or tri-cyclic. When the cyclic olefin comprises more than one ring, the rings may or may not be fused. Preferred examples of cyclic olefins that comprise multiple rings include norbornene, dicyclopentadiene, tricyclopentadiene, and 5-ethylidene-2-norbornene.

The cyclic olefin may also be substituted, for example, a $C_5$ to $C_{24}$ cyclic hydrocarbon wherein one or more (typically 2, 3, 4, or 5) of the hydrogens are replaced with non-hydrogen substituents. Suitable non-hydrogen substituents may be chosen from the substituents described hereinabove. For example, functionalized cyclic olefins, i.e., $C_5$ to $C_{24}$ cyclic hydrocarbons wherein one or more (typically 2, 3, 4, or 5) of the hydrogens are replaced with functional groups, are within the scope of the invention. Suitable functional groups may be chosen from the functional groups described hereinabove. For example, a cyclic olefin functionalized with an alcohol group may be used to prepare a telechelic polymer comprising pendent alcohol groups. Functional groups on the cyclic olefin may be protected in cases where the functional group interferes with the metathesis catalyst, and any of the protecting groups commonly used in the art may be employed. Acceptable protecting groups may be found, for example, in Greene et al., Protective Groups in Organic Synthesis, 3rd Ed. (New York: Wiley, 1999). Examples of functionalized cyclic olefins include without limitation 2-hydroxymethyl-5-norbornene, 2-[(2-hydroxyethyl)carboxylate]-5-norbornene, cydecanol, 5-n-hexyl-2-norbornene, 5-n-butyl-2-norbornene.

Cyclic olefins incorporating any combination of the abovementioned features (i.e., heteroatoms, substituents, multiple olefins, multiple rings) are suitable for the methods disclosed herein. Additionally, cyclic olefins incorporating any combination of the abovementioned features (i.e., heteroatoms, substituents, multiple olefins, multiple rings) are suitable for the invention disclosed herein.

The cyclic olefins useful in the methods disclosed herein may be strained or unstrained. It will be appreciated that the amount of ring strain varies for each cyclic olefin compound, and depends upon a number of factors including the size of the ring, the presence and identity of substituents, and the presence of multiple rings. Ring strain is one factor in determining the reactivity of a molecule towards ring-opening olefin metathesis reactions. Highly strained cyclic olefins, such as certain bicyclic compounds, readily undergo ring opening reactions with olefin metathesis catalysts. Less strained cyclic olefins, such as certain unsubstituted hydrocarbon monocyclic olefins, are generally less reactive. In some cases, ring opening reactions of relatively unstrained (and therefore relatively unreactive) cyclic olefins may become possible when performed in the presence of the olefinic compounds disclosed herein.

A plurality of cyclic olefins may be used with the present invention to prepare metathesis polymers. For example, two cyclic olefins selected from the cyclic olefins described hereinabove may be employed in order to form metathesis products that incorporate both cyclic olefins. Where two or more cyclic olefins are used, one example of a second cyclic olefin is a cyclic alkenol, i.e., a $C_5$-$C_{24}$ cyclic hydrocarbon wherein at least one of the hydrogen substituents is replaced with an alcohol or protected alcohol moiety to yield a functionalized cyclic olefin.

The use of a plurality of cyclic olefins, and in particular when at least one of the cyclic olefins is functionalized, allows for further control over the positioning of functional groups within the products. For example, the density of cross-linking points can be controlled in polymers and macromonomers prepared using the methods disclosed herein. Control over the quantity and density of substituents and functional groups also allows for control over the physical properties (e.g., melting point, tensile strength, glass transition temperature, etc.) of the products. Control over these and other properties is possible for reactions using only a single cyclic olefin, but it will be appreciated that the use of a plurality of cyclic olefins further enhances the range of possible metathesis products and polymers formed.

More preferred cyclic olefins include dicyclopentadiene; tricyclopentadiene; dicyclohexadiene; norbornene; 5-methyl-2-norbornene; 5-ethyl-2-norbornene; 5-isobutyl-2-norbornene; 5,6-dimethyl-2-norbornene; 5-phenylnorbornene; 5-benzylnorbornene; 5-acetylnorbornene; 5-methoxycarbonylnorbornene; 5-ethoxycarbonyl-1-norbornene; 5-methyl-5-methoxy-carbonylnorbornene; 5-cyanonorbornene; 5,5,6-trimethyl-2-norbornene; cyclo-hexenylnorbornene; endo, exo-5,6-dimethoxynorbornene; endo, endo-5,6-dimethoxynorbornene; endo, exo-5-6-dimethoxycarbonylnorbornene; endo, endo-5,6-dimethoxycarbonylnorbornene; 2,3-dimethoxynorbornene; norbornadiene; tricycloundecene; tetracyclododecene; 8-methyltetracyclododecene; 8-ethyltetracyclododecene; 8-methoxycarbonyltetracyclododecene; 8-methyl-8-tetracyclo-dodecene; 8-cyanotetraclododecene; pentacyclopentadecene; pentacyclohexadecene; higher order oligomers of cyclopentadiene such as cyclopentadiene tetramer, cyclopentadiene pentamer, and the like; and $C_2$-$C_{12}$ hydrocarbyl substituted norbornenes such as 5-butyl-2-norbornene; 5-hexyl-2-norbornene; 5-octyl-2-norbornene; 5-decyl-2-norbornene; 5-dodecyl-2-norbornene; 5-vinyl-2-norbornene; 5-ethylidene-2-norbornene; 5-isopropenyl-2-norbornene; 5-propenyl-2-norbornene; and 5-butenyl-2-norbornene, and the like. Even more preferred cyclic olefins include dicyclopentadiene, tricyclopentadiene, and higher order oligomers of cyclopentadiene, such as cyclopentadiene tetramer, cyclopentadiene pentamer, and the like, tet-racyclododecene, norbornene, and $C_2$-$C_{12}$ hydrocarbyl substituted norbornenes, such as 5-butyl-2-norbornene, 5-hexyl-2-norbornene, 5-octyl-2-norbornene, 5-decyl-2-norbornene, 5-dodecyl-2-norbornene, 5-vinyl-2-norbornene, 5-ethylidene-2-norbornene, 5-isopropenyl-2-norbornene, 5-propenyl-2-norbornene, 5-butenyl-2-norbornene, and the like.

In certain embodiments, each of these Structures A-F may further comprise pendant substituents that are capable of crosslinking with one another or added crosslinking agents. For example $R^{A1}$, $R^{A2}$, $R^{B1}$, $R^{B2}$, $R^{B3}$, $R^{B4}$, $R^{B5}$, $R^{B6}$, $R^{C1}$, $R^{C2}$, $R^{C3}$, $R^{C4}$, $R^{C5}$, $R^{C6}$, $R^{D1}$, $R^{D2}$, $R^{D3}$, $R^{D4}$, $R^{E1}$, $R^{E2}$, $R^{E3}$, $R^{E4}$, $R^{E5}$, $R^{E6}$, $R^{E7}$, $R^{E8}$, $R^{F1}$, $R^{F2}$, $R^{F3}$, and $R^{F4}$ may independently represent pendant hydrocarbyl chains containing olefinic or acetylenic bonds capable of crosslinking with themselves or other unsaturated moieties under metathesis conditions. Additionally, within Structures A-F, at least one pair of substituents, $R^{B1}$ and $R^{B2}$, $R^{B3}$ and $R^{B4}$, and $R^{B5}$ and $R^{B6}$, $R^{C1}$ and $R^{C2}$, $R^{C5}$ and $R^{C6}$, $R^{D2}$ and $R^{D3}$, $R^{E5}$ and $R^{E6}$, $R^{E7}$ and $R^{E8}$, $R^{F1}$ and $R^{F2}$, and $R^{F3}$ and $R^{F4}$, can together form an optionally substituted exocyclic double bond, for example /=CH($C_{1-6}$—Fn). This concept is specifically exemplified in the Examples, where a compound of Structure (F), where a is a single bond, g is 0, $R^{F1}$=$R^{F2}$=H and $R^{F3}$ and $R^{F4}$ together form /=CH(ethyl) is reacted with oligomers of cyclooctadiene.

When considering alternative olefinic precursors in the present methods, more preferred precursors may be those which, which when incorporated into polyacetylene polymers or copolymers, modify the electrical or physical character of the resulting polymer. One general class of such precursors are substituted annulenes and annulynes, for example [18]annulene-1,4; 7,10; 13,16-trisulfide. When co-polymerized with acetylene, this precursor can form a block co-polymer as shown here:

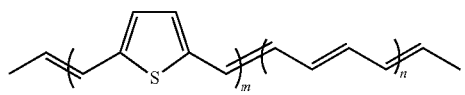

Substituted analogs of these trisulfides, as described below can also be used to provide corresponding substituted poly (thienylvinylene)-containing polymers or copolymers. For example, the 2,3,8,9,14,15-hexaoctyl derivative of [18]annulene-1,4; 7,10; 13,16-trisulfide is described in Horie, et al., "Poly(thienylvinylene) prepared by ring-opening metathesis polymerization: Performance as a donor in bulk heterojunction organic photovoltaic devices," *Polymer* 51 (2010) 1541-1547, which is incorporated by reference herein for all purposes

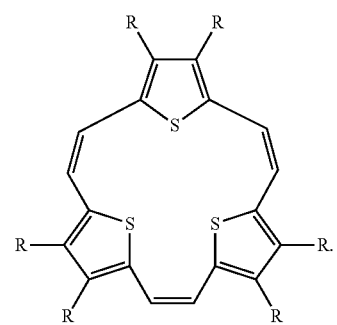

R = Octyl

Metatheses Reactions

The metathesis reactions contemplated by the present inventions include Ring-Opening Metathesis Polymerization (ROMP), Ring-Closing Metathesis (RCM), and Cross Metathesis (CM). While often described in terms of "olefin metathesis," it should also be understood that both olefinic and acetylenic bonds can participate in such reactions, and so as used herein, the term "olefin metathesis" is to be interpreted as involving the redistribution of olefinic or acetylenic bonds. Each of these types of reactions is well known to those skilled in the relevant art in this capacity.

In those contemplated embodiment related to photoresists (to be described further infra), the descriptions are generally provided in terms of selective polymerizations, for example by ROMP or cross-metathesis, so as to provide spatially specific regions of cross-linked polymers. But it should also be appreciated that this spatial and temporal selectivity available by the photoactivated catalysts may also be applied to change the solubility properties of the irradiated region without crosslinking—for example by only partial reaction of the precursors, cross metathesis of an olefinic precursor with a polymer, or through depolymerization.

Photosensitive Compositions, Including Photoresists

As should be appreciated by the descriptions herein, one of the several features of the present inventions is the ability to spatially and temporally control the catalytic activities of the systems with remarkable precision, owing to the high contrast in activity between the irradiated and unirradiated catalysts. The high activities of the irradiated catalysts allows for good activity, even at low embedded catalyst concentrations. In some embodiments, the Fischer-type carbene catalyst, including the Fischer-type carbene ruthenium catalyst, is present at a concentration in a range of from about 0.001% to about 5% by weight, relative to the weight of the entire composition. The systems also allow for higher concentrations, for example up to about 10 or 15% by weight, relative to the weight of the entire composition, but here cost begins to become dissuasive for most practical applications.

As described above, the methods of the present invention also consider that the Fischer-type carbene catalyst, including the Fischer-type carbene ruthenium catalyst, as described herein, may be dissolved in a solvent in the presence of at least one unsaturated organic precursor or are admixed or dissolved in at least one unsaturated organic precursor. In the circumstances where the user contemplates the use of these compositions as photoresists, the Fischer-type catalyst may be added to the organic precursor directly or generated in situ as described elsewhere herein. This in situ generation of the catalyst may involve providing a catalyst containing a Schrock-type carbene, which is subsequently quenched to form the Fischer-type carbene catalyst. If so, the generation of the catalyst may be accompanied by partial polymerization or cross-linking of the originally added organic precursor, and the intermediate viscosity of this partial polymerized or cross-linked composition may be controlled by the time before quenching. Raising the viscosity of the photosensitive compositions provides several advantages, including improving the oxidative stability of the otherwise potentially air-sensitive catalysts. The raised viscosity also controls the diffusion length of the active catalyst species through the composition, which in turn can improve the resolution of the lithographically defined structures.

In some embodiments, it is convenient to use a non-reactive solvent (low boiling solvents may be preferred, such as methylene chloride, tetrahydrofuran, diethyl ether, toluene, etc.) to provide and maintain lower initial viscosities, so as to allow for more efficient intimate mixing of the catalyst within the total composition. Once the catalyst is intimately distributed within the composition, the non-reactive solvent may be conveniently removed, for example under vacuum or with heat. In some cases, once the Fischer-type catalyst is added or prepared, additional or different organic precursor may be added to dilute the catalyst further. The viscosity of the final, unexposed product may be adjusted by the type and amount of the constituents. For example, in some embodiments, the viscosity is such that the composition is suitable for spin-coating, dip coating, or spraying. In other embodiments, the photosensitive composition can have the form of a gelled or solid film. In various independent embodiments, the viscosity of the composition, at the contemplated temperature of application (preferably ambient room temperature) is in a range of from about 1 cSt to about 10 cSt, from about 10 cSt to about 50 cSt, from about 50 cSt to about 100 cSt, from about 100 cSt to about 250 cSt, from about 250 cSt to about 500 cSt, from about 500 cSt to about 1000 cSt, from about 1000 cSt to about 2000 cSt, from about 2000 cSt to about 5000 cSt, or higher. Higher viscosities appear provide increased oxidative stability of the ruthenium carbene catalysts.

Accordingly, in specific embodiments, the photosensitive composition comprises a Fischer-type carbene ruthenium catalyst generated in situ by the reaction between:

a quenching agent of

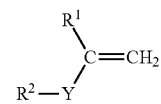

and a Grubbs-type metathesis catalyst of Formula (I)

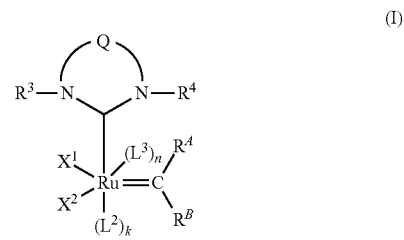

wherein:

$L^2$, and $L^3$ are neutral electron donor ligands;

k and n are independently 0 or 1;

$X^1$ and $X^2$ are anionic ligands;

Y is O, $N(R^2)$, or S, preferably O or N(H); and

Q is a two-atom linkage having the structure —$CR^{11}R^{12}$—$CR^{13}R^{14}$— or —$CR^{11}$=$CR^{13}$—, preferably —$CR^{11}R^{12}$—$CR^{13}R^{14}$—, wherein $R^{11}$, $R^{12}$, $R^{13}$, and $R^{14}$ are independently selected from hydrogen, hydrocarbyl, substituted hydrocarbyl, heteroatom-containing hydrocarbyl, substituted heteroatom-containing hydrocarbyl, and functional groups.

$R^1$, $R^2$, $R^A$, and $R^B$ are independently selected from hydrogen, optionally substituted hydrocarbyl, optionally substituted heteroatom-containing hydrocarbyl, functional groups, or may be linked to form a cyclic group, which may be aliphatic or aromatic, and may contain substituents and/or heteroatoms;

$R^3$ and $R^4$ are independently hydrogen, optionally substituted hydrocarbyl, or optionally substituted heteroatom-containing hydrocarbyl; and wherein any two or more of $X^1$, $X^2$, $L^1$, $L^2$, $L^3$, $R^1$, and $R^2$ can be taken together to form one or more cyclic groups.

In other embodiments, and as described above, the Fischer-type carbene ruthenium catalyst is represented by the structure of Formula (II):

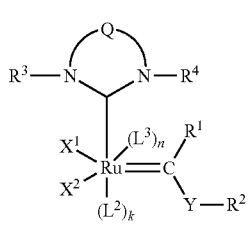

(II)

wherein $L^2$, $L^3$, k, n, $X^1$, $X^2$, Y, Q, $R^1$, $R^2$, $R^3$, and $R^4$ are as described above.

In some embodiments, photoresists may also be prepared using and comprise ruthenium carbide catalysts having a structure of Formula (III), or acidified derivatives thereof:

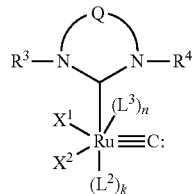

where $L^2$, $L^3$, k, n, $X^1$, $X^2$, Y, Q, $R^1$, $R^2$, $R^3$, and $R^4$ are as described above. See Example 7.

Part of the challenge in developing an olefin metathesis-based photoresist is achieving a stark contrast between the reactivity of the catalyst in the light and the dark. Additionally, the requirements of ambient stability and processability present barriers to the industrial implementation of transition metal based photocatalysts. In the present invention, certain embodiments provide that a standard quenching procedure for ROMP reactions generates a photoactive latent catalyst. This serendipitous discovery allows for the facile synthesis of a new family of photocurable materials. The addition of substituted vinyl ethers is a widely employed method of quenching ROMP reactions. The regioselective formation of vinyl ether complexes is extremely rapid and irreversible under certain conditions, leading to the use of vinyl ether "trapping" as a tool for determining catalyst initiation rates. The resultant ruthenium Fischer-type carbenes are generally considered to be unreactive. While not intending to be bound by the correctness or incorrectness of any particular theory, it appears that quenching a living ROMP reaction yields a methylene-terminated polymer chain and a presumably 14-electron ruthenium vinyl ether. While the phosphine or pyridine ligands typically found on ruthenium ROMP catalysts could in principle re-coordinate to the quenched complex, the statistical likelihood of this is extremely low considering the concentration and stoichiometry of typical ROMP reactions. In addition, the air-sensitivity of the ruthenium vinyl ether complexes aids in the quenching process, through almost immediate decomposition of the alkylidene species. A typical quenching procedure utilizes excess vinyl ether and immediate precipitation of the polymer to remove the catalyst.

The photosensitive compositions, including photoresists, may additionally comprise other materials, so long as their presence does not interfere with the ability of the photoactivated catalysts to effect the metathesis reactions under irradiation conditions. For example, these compositions, including photoresists, may contain colorants, surfactants, and stabilizers, as well as functional particles including, for example, nanostructures (including carbon and inorganic nanotubes), magnetic materials (e.g., ferrites), and quantum dots.

Methods of Patterning a Polymer on a Substrate

Embodiments of the present invention also provide methods of providing patterned polymer layers using the Fischer-type carbene photocatalysts, which may be described as PhotoLithographic Olefin Metathesis Polymerization (PLOMP). In this procedure, a latent metathesis catalyst is activated by light to react with the olefins in the surrounding environment, providing for the development of a negative tone resist by using the photocatalyst to polymerize, crosslink, or both polymerize and crosslink a difunctional ROMP monomer or other unsaturated precursor within a matrix of linear polymer or polymer precursor. In principle, a positive tone resist can also be developed, by using light-triggered secondary metathesis events to increase the solubility of the irradiated regions. This can be considered a "chemically amplified" resist, in that the photoactive species is a catalyst for the crosslinking of the polymer matrix. The versatility of these ruthenium-mediated olefin metathesis reactions can now be utilized to photopattern a variety of functional materials via PLOMP, advancing the field of photoinitiated olefin metathesis from a curiosity to materials science applicable to mass microfabrication.

Some embodiments provide methods of patterning a polymeric image on a substrate, each method comprising;

(a) depositing a layer of photosensitive composition of any one of the compositions described herein on the substrate;

(b) irradiating a portion of the layer of photosensitive composition with a light comprising a wavelength in a range of from about 220 to about 440 nm, preferably in a range of from about 240 to about 260 nm, or from about 260 nm to about 340 nm, or from about 340 to about 360 nm, or a combination thereof, more preferably in a range of from about 240 to about 260 nm or from about 340 to about 360 nm, so as to polymerize the irradiated portion of the layer, thereby providing a patterned layer of polymerized and unpolymerized regions. Certain other embodiments further comprise removing the unpolymerized region of the pattern.

In principle, the substrates can comprise any metallic or non-metallic; organic or inorganic; conductive, semi-conductive, or non-conductive material, or any combination thereof. Even so, it is contemplated that these patterned polymer layers will find utility in electronic applications including those where semiconductor wafers comprising silicon, GaAs, and InP. One of the many advantages of these inventive systems, certainly over many commercial resists, is the ability to maintain surface adhesion to the native oxide surfaces of silicon wafers, for example, without any etching or surface derivatization. By contrast, many commercial photoresists require HF etching of the oxide and/or surface derivatization with reactive molecules such as hexamethyldisilazane. In this respect, the presently described photosensitive systems offer a safer and more versatile alternative, as the polymer composition can be easily tuned to modulate adhesion. For examples, in the examples described herein, the poly(COD) resist batches showed excellent adhesion to silicon coupons, which were first cleaned with piranha. Additionally, the PLOMP resists do not require post-exposure baking to develop. Currently, ruthenium-mediated ROMP is employed in a number of industrial scale applications, including high-modulus resins and extremely chemically resistant materials. PLOMP can provide UV-curable and patternable coatings with these desired materials properties. Finally, the ability to generate many batches of resist in a single workday enables rapid prototyping for future development.

In some embodiments, the patterned polymers may be processed to form single layer or multilayer polymer structures. In multilayer structures, each layer may be the same or different than any other of the deposited layer, and may be individually patterned as described herein. Similarly, each layer may be interleaved with intermediately deposited metal, metal oxide, or other material layer. These interlayers may be deposited for example by sputtering, or other chemical or vapor deposition technique, provided the processing of these interlayers does not adversely effect the quality of the patterned layers of deposited polymers.

The photosensitive compositions may be deposited by spin coating, dip coating, or spray coating, or alternatively, depending on the physical form of the photosensitive composition, may be deposited by laminating a gelled or solid film on the substrate.

The photosensitive compositions may be irradiated by any variety of methods known in the art. In certain embodiments, patterning may be achieved by photolithography, using a positive or negative image photomask. In other embodiments, patterning may be achieved by interference lithography (i.e., using a diffraction grating). In other embodiments, patterning may be achieved by proximity field nanopatterning. In still other embodiments, patterning may be achieved by diffraction gradient lithography. In still other embodiments, patterning may be used by a direct laser writing application of light, such as by multi-photon lithography.

The Fischer-type carbene catalysts, including Fischer-type carbene ruthenium catalysts, can be activated using light having at least one wavelength in a range of from about 220 to about 440 nm, preferably in a range of from about 240 to about 260 nm, or from about 260 nm to about 340 nm, or from about 340 to about 360 nm, or a combination thereof, more preferably in a range of from about 240 to about 260 nm or from about 340 to about 360 nm. As described above, the intensity of this at least wavelength is in a range of about 2 watts to about 6000 watts, preferably about 2 watts to about 10 watts.

Figure 3A:
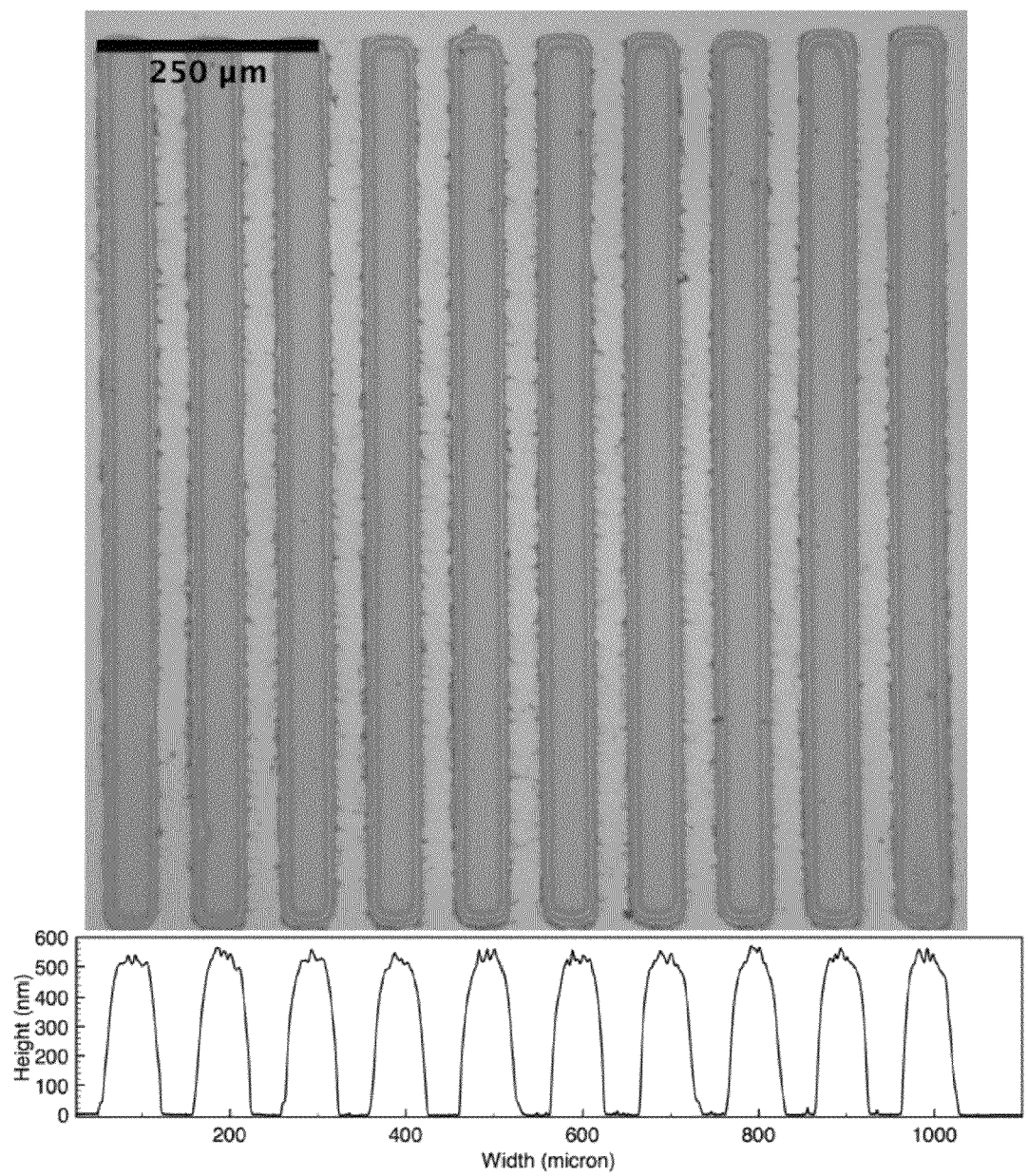
FIG. 3A and FIG. 3B provide micrographs patterns of 1 mm long bars, with widths of 50 microns (FIG. 3A) and 30 microns (FIG. 3B) made by the present invention. The height profiles of the same bar arrays are shown beneath micrograph, as measured by profilometry.
Figure 3B:
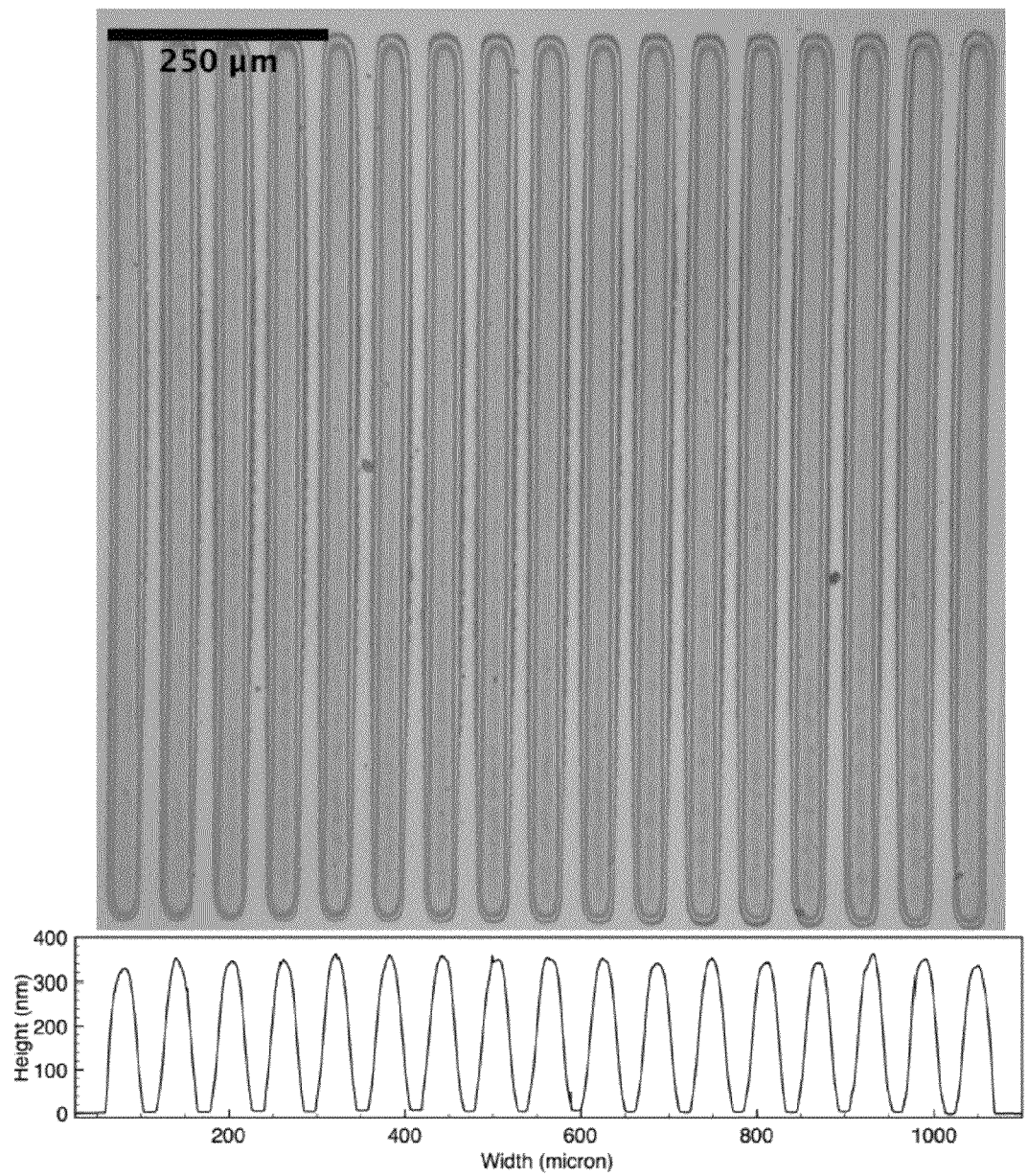
Figure 4:
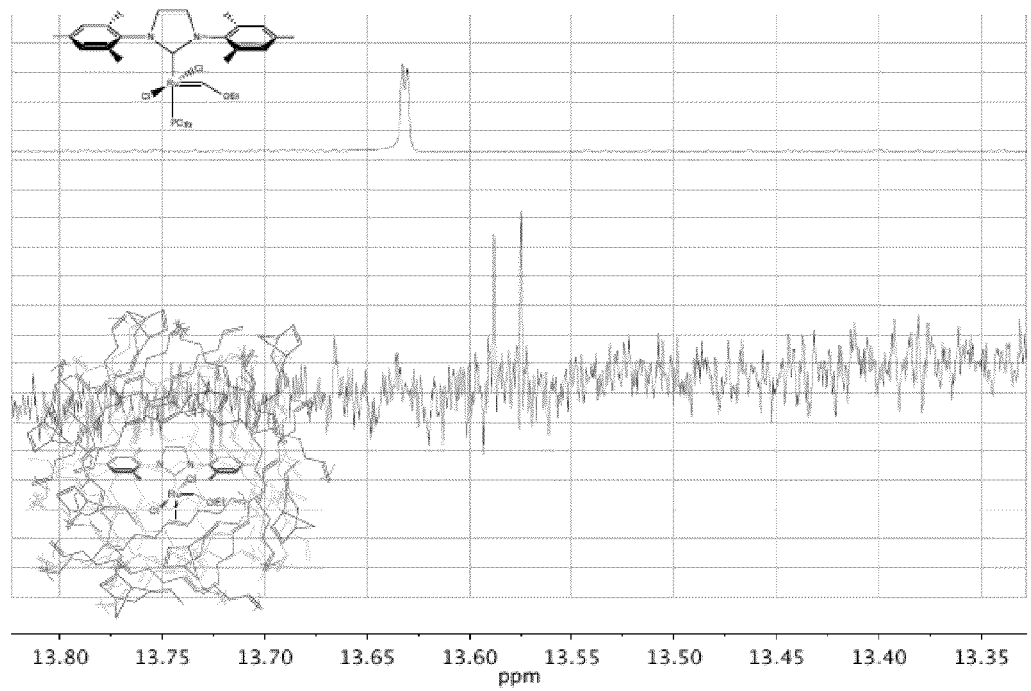
FIG. 4 shows the $^1$H spectra in $CD_2Cl_2$ of complex 2 and a PLOMP photoresist as described in Example 6. The region of the alkylidene proton is shown to highlight the similarity between the two. No other peaks were observed in the downfield region ($\delta$=11-22 ppm), suggesting that no other ruthenium alkylidene species were present in any significant quantity.

The dimensions of the resulting features of the polymerized structures are, in part, dictated by the wavelength of the irradiating light, the method of irradiation, and the character of the photosensitive compositions. Higher viscosities and the optional presence of additional quenchants may usefully minimize diffusion of the catalyst in the composition, so as to provide for better resolution. In certain embodiments, the polymerized polymer exhibits features (e.g., channels, ridges, holes, or posts) having dimensions on the millimeter scale (e.g., from about 1 mm to about 10 mm, from about 10 mm to about 50 mm, from about 50 mm to about 100 mm, from about 100 mm to about 500 mm, from about 500 mm to about 1000 mm, or a combination thereof), the micron scale (e.g., from about 1 micron to about 10 microns, from about 10 microns to about 50 microns, from about 50 microns to about 100 microns, from about 100 microns to about 500 microns, from about 500 microns to about 1000 microns, or a combination thereof), or the nanometer scale (e.g., from about 1 nm to about 10 nm, from about 10 nm to about 50 nm, from about 50 nm to about 100 nm, from about 100 nm to about 500 nm, from about 500 nm to about 1000 nm, or a combination thereof). See, e.g., FIG. 3. Interference or diffraction gradient lithography may provide for polymer layers having continuous or discontinuous thicknesses.

The following listing of embodiments in intended to complement, rather than displace or supersede, the previous descriptions.

Embodiment 1

A method of metathesizing an unsaturated organic precursor comprising irradiating a Fischer-type carbene ruthenium catalyst with at least one wavelength of light in the presence of at least one unsaturated organic precursor, each precursor having at least one alkene or one alkyne bond, so as to metathesize at least one alkene or one alkyne bond.

Embodiment 2

The method of Embodiment 1, wherein the Fischer-type carbene ruthenium catalyst is generated in situ by the reaction between:

a quenching agent of

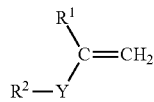

and a Grubbs-type metathesis catalyst of Formula (I)

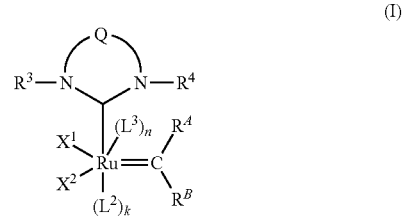

(I)

wherein:

$L^2$, and $L^3$ are neutral electron donor ligands;

k and n are independently 0 or 1;

$X^1$ and $X^2$ are anionic ligands;

Y is O, N—$R^1$, or S, preferably O or N—$R^1$; and

Q is a two-atom linkage having the structure —$CR^{11}R^{12}$—$CR^{13}R^{14}$— or —$CR^{11}$=$CR^{13}$—, preferably —$CR^{11}R^{12}$—$CR^{13}R^{14}$—, wherein $R^{11}$, $R^{12}$, $R^{13}$ and $R^{14}$ are independently selected from hydrogen, hydrocarbyl, substituted hydrocarbyl, heteroatom-containing hydrocarbyl, substituted heteroatom-containing hydrocarbyl, and functional groups.

$R^1$, $R^2$, $R^A$, and $R^B$ are independently selected from hydrogen, optionally substituted hydrocarbyl, optionally substituted heteroatom-containing hydrocarbyl, functional groups, or may be linked to form a cyclic group, which may be aliphatic or aromatic, and may contain substituents and/or heteroatoms;

$R^3$ and $R^4$ are independently hydrogen, optionally substituted hydrocarbyl, or optionally substituted heteroatom-containing hydrocarbyl; and wherein any two or more of $X^1$, $X^2$, $L^1$, $L^2$, $L^3$, $R^1$, and $R^2$ can be taken together to form one or more cyclic groups.

Embodiment 3

The method of Embodiment 1 or 2, wherein the Fischer-type carbene ruthenium catalyst is represented by the structure of Formula (II):

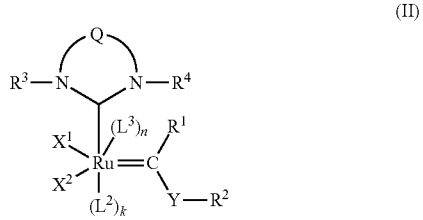

(II)

wherein
$L^2$, and $L^3$ are neutral electron donor ligands;
k and n are independently 0 or 1;
$X^1$ and $X^2$ are anionic ligands;
Y is O, N—$R^1$, or S, preferably O or N—$R^1$; and
Q is a two-atom linkage having the structure —$CR^{11}R^{12}$—$CR^{13}R^{14}$— or —$CR^{11}$=$CR^{13}$—, preferably —$CR^{11}R^{12}$—$CR^{13}R^{14}$—, wherein $R^{11}$, $R^{12}$, $R^{13}$ and $R^{14}$ are independently selected from hydrogen, hydrocarbyl, substituted hydrocarbyl, heteroatom-containing hydrocarbyl, substituted heteroatom-containing hydrocarbyl, and functional groups.

$R^1$ and $R^2$ are independently selected from hydrogen, optionally substituted hydrocarbyl, optionally substituted heteroatom-containing hydrocarbyl, functional groups, or may be linked to form a cyclic group, which may be aliphatic or aromatic, and may contain substituents and/or heteroatoms;

$R^3$ and $R^4$ are independently hydrogen, optionally substituted hydrocarbyl, or optionally substituted heteroatom-containing hydrocarbyl; and
wherein any two or more of $X^1$, $X^2$, $L^1$, $L^2$, $L^3$, $R^1$, and $R^2$ can be taken together to form one or more cyclic groups.

Embodiment 4

The method of Embodiment 3, wherein the Ru=C($R^1$)(Y—$R^2$) moiety is a substituted vinyl ether carbene.

Embodiment 5

The method of any one of Embodiments 2 to 4, wherein $R^2$ is $C_{1-6}$ alkyl, preferably ethyl or butyl.

Embodiment 6

The method of any one of Embodiments 2 to 5, wherein Q is —$CH_2$—$CH_2$— and $R^3$ and $R^4$ are mesityl.

Embodiment 7

The method of any one of claims 1 to 6, wherein the metathesis, upon irradiation, proceeds at a rate faster than the metathesis in the absence of irradiation, for example at least 2 times, at least 5 times, at least 10 times, at least 50 times, at least 100 times, or at least 1000 times faster, than the metathesis in the absence of irradiation.

Embodiment 8

The method of any one of Embodiments 1 to 7, wherein the Fischer-type carbene ruthenium catalyst is irradiated with a light comprising a wavelength in a range of from about 220 to about 440 nm, preferably in a range of from about 240 to about 260 nm, or from about 260 nm to about 340 nm, or from about 340 to about 360 nm, or a combination thereof, more preferably in a range of from about 240 to about 260 nm or from about 340 to about 360 nm.

Embodiment 9

The method of any one of Embodiments 1 to 8, wherein the Fischer-type carbene ruthenium catalyst is irradiated with a light of at least one wavelength in a range of about 220 to 440 nm having an intensity in a range of about 2 watts to about 6000 watts.

Embodiment 10

The method of any one of claims 1 to 9, wherein the Fischer-type carbene ruthenium catalyst and at least unsaturated organic precursor are dissolved in a solvent.

Embodiment 11

The method of any one of Embodiments 1 to 10, wherein the Fischer-type carbene ruthenium catalyst is admixed or dissolved in at least one unsaturated organic precursor.

Embodiment 12

The method of any one of Embodiments 1 to 11, wherein the metathesis results in the cross-metathesis of the organic precursors.

Embodiment 13

The method of any one of Embodiments 1 to 12, wherein the metathesis results in the polymerization of the at least one olefin precursor.

Embodiment 14

The method of any one of Embodiments 1 to 13, wherein the at least one unsaturated organic precursor is a cyclic unsaturated compound.

Embodiment 15

A photosensitive composition comprising a Fischer-type carbene ruthenium catalyst admixed (dissolved) within a matrix of at least one unsaturated organic precursor, each precursor having at least one alkene or one alkyne bond, wherein the ruthenium carbene catalyst is activated by irradiation of light comprising at least one wavelength in a range of from about 220 to about 440 nm, preferably in a range of from about 240 to about 260 nm, or from about 260 nm to about 340 nm, or from about 340 to about 360 nm, or a combination thereof, more preferably in a range of from about 240 to about 260 nm or from about 340 to about 360 nm.

Embodiment 16

The photosensitive composition of Embodiment 15, wherein the Fischer-type carbene ruthenium catalyst is generated in situ by the reaction between:

a quenching agent of

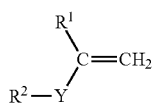

and a Grubbs-type metathesis catalyst of Formula (I)

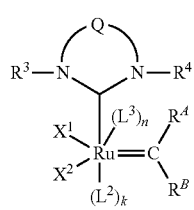

wherein:
$L^2$, and $L^3$ are neutral electron donor ligands;
k and n are independently 0 or 1;
$X^1$ and $X^2$ are anionic ligands;
Y is O, N—$R^1$, or S; and
Q is a two-atom linkage having the structure —$CR^{11}R^{12}$—$CR^{13}R^{14}$— or —$CR^{11}$=$CR^{13}$—, preferably —$CR^{11}R^{12}$—$CR^{13}R^{14}$—, wherein $R^{11}$, $R^{12}$, $R^{13}$ and $R^{14}$ are independently selected from hydrogen, hydrocarbyl, substituted hydrocarbyl, heteroatom-containing hydrocarbyl, substituted heteroatom-containing hydrocarbyl, and functional groups.

$R^1$, $R^2$, $R^A$, and $R^B$ are independently selected from hydrogen, optionally substituted hydrocarbyl, optionally substituted heteroatom-containing hydrocarbyl, functional groups, or may be linked to form a cyclic group, which may be aliphatic or aromatic, and may contain substituents and/or heteroatoms;

$R^3$ and $R^4$ are independently hydrogen, optionally substituted hydrocarbyl, or optionally substituted heteroatom-containing hydrocarbyl; and wherein any two or more of $X^1$, $X^2$, $L^1$, $L^2$, $L^3$, $R^1$, and $R^2$ can be taken together to form one or more cyclic groups.

Embodiment 17

The photosensitive composition of Embodiment 15 or 16, wherein the Fischer-type carbene ruthenium catalyst is represented by the structure of Formula (II):

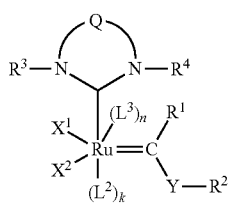

wherein
$L^2$, and $L^3$ are neutral electron donor ligands;
k and n are independently 0 or 1;
$X^1$ and $X^2$ are anionic ligands;
Y is O, N—$R^1$, or S, preferably O or N—$R^1$; and
Q is a two-atom linkage having the structure —$CR^{11}R^{12}$—$CR^{13}R^{14}$— or —$CR^{11}$=$CR^{13}$—, preferably —$CR^{11}R^{12}$—$CR^{13}R^{14}$—, wherein $R^{11}$, $R^{12}$, $R^{13}$ and $R^{14}$ are independently selected from hydrogen, hydrocarbyl, substituted hydrocarbyl, heteroatom-containing hydrocarbyl, substituted heteroatom-containing hydrocarbyl, and functional groups.

$R^1$ and $R^2$ are independently selected from hydrogen, optionally substituted hydrocarbyl, optionally substituted heteroatom-containing hydrocarbyl, functional groups, or may be linked to form a cyclic group, which may be aliphatic or aromatic, and may contain substituents and/or heteroatoms;

$R^3$ and $R^4$ are independently hydrogen, optionally substituted hydrocarbyl, or optionally substituted heteroatom-containing hydrocarbyl; and wherein any two or more of $X^1$, $X^2$, $L^1$, $L^2$, $L^3$, $R^1$, and $R^2$ can be taken together to form one or more cyclic groups.

Embodiment 18

The photosensitive composition of any one of Embodiments 15 to 17, wherein the at least one unsaturated organic precursor comprises at least one alkene, alkyne, or both alkene and alkyne moieties and is capable of polymerizing when metathesized.

Embodiment 19

The photosensitive composition of any one of Embodiments 15 to 18, wherein the at least one unsaturated organic precursor comprises a cyclic alkene or an alicyclic di-alkene.

Embodiment 20

The photosensitive composition of any one of Embodiments 15 to 19, wherein the Fischer-type carbene ruthenium catalyst is present at a concentration in a range of from about 0.001% to about 5% by weight, relative to the weight of the entire composition.

Embodiment 21

The photosensitive composition of any one of Embodiments 15 to 20, wherein the composition has a viscosity suitable for spin coating, dip coating, or spraying, for example with a viscosity of the composition, at the contemplated temperature of application (preferably ambient room temperature) is in a range of from about 1 cSt to about 10 cSt, from about 10 cSt to about 50 cSt, from about 50 cSt to about 100 cSt, from about 100 cSt to about 250 cSt, from about 250 cSt to about 500 cSt, from about 500 cSt to about 1000 cSt, from about 1000 cSt to about 2000 cSt, from about 2000 cSt to about 5000 cSt, or higher.

Embodiment 22

The photosensitive composition of any one of Embodiments 15 to 21, wherein the composition has a form of a gelled or solid film.

Embodiment 23

A method of patterning a polymeric image on a substrate, said method comprising; (a) depositing a layer of photosensitive composition on a substrate, said photosensitive composition comprising a Fischer-type carbene ruthenium catalyst admixed or dissolved within a matrix of at least one unsaturated organic precursor such as described in of any one of claims 15 to 22; and (b) irradiating a portion of the layer of photosensitive composition with a light comprising a wavelength in a range of from about 220 to about 440 nm, preferably in a range of from about 240 to about 260 nm, of from about 260 nm to about 340 nm, or from about 340 to about 360 nm, or a combination thereof, more preferably in a range of from about 240 to about 260 nm or from about 340 to about 360 nm, so as to polymerize the irradiated portion of the layer, thereby providing a patterned layer of polymerized and unpolymerized regions.

Embodiment 24

The method of Embodiment 23, wherein the photosensitive composition is deposited by spin coating, dip coating, or spray coating.

Embodiment 25

The method of Embodiment 23 or 24, wherein photosensitive composition is a gelled or solid film and is deposited by laminating on the substrate.

Embodiment 26

The method of any one of Embodiments 23 to 25, wherein the irradiated portion is patterned by a photomask.

Embodiment 27

The method of any one of Embodiments 23 to 25, wherein the irradiated portion is patterned by a direct writing application of light.

Embodiment 28

The method of any one of Embodiments 23 to 25, wherein the irradiated portion is patterned by interference or diffraction gradient lithography.

Embodiment 29

The method of any one of Embodiments 23 to 28, wherein the light has an intensity in a range of about 2 watts to about 6000 watts at at least one wavelength in the range of about 220 to 440 nm.

Embodiment 30

The method of any one of Embodiments 23 to 29, wherein the patterned layer comprises features having dimensions on the nanometer or micron scale.

Embodiment 31

The method of any one of Embodiments 23 to 30, further comprising removing the unpolymerized region of the pattern.

Embodiment 32

A patterned polymer layer prepared according to any one of Embodiments 23 to 31, or an article of manufacture comprising the patterned polymer layer.

EXAMPLES

The following Examples are provided to illustrate some of the concepts described within this disclosure. While each Example is considered to provide specific individual embodiments of composition, methods of preparation and use, none of the Examples should be considered to limit the more general embodiments described herein.

In the following examples, efforts have been made to ensure accuracy with respect to numbers used (e.g. amounts, temperature, etc.) but some experimental error and deviation should be accounted for. Unless indicated otherwise, temperature is in degrees C., pressure is at or near atmospheric.

Example 1

Materials and Methods

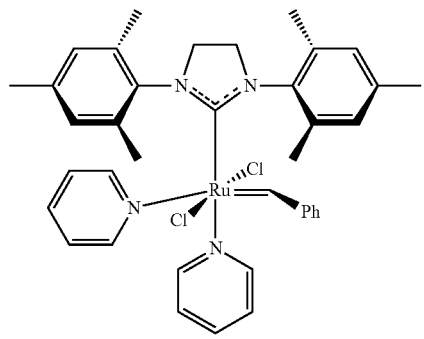

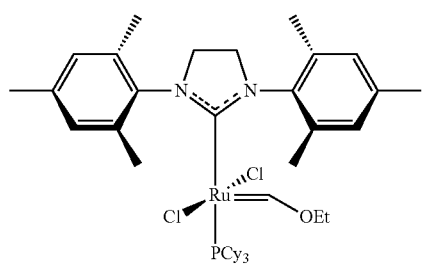

$(H_2IMes)(PPh_3)(Cl)_2RuCHPh$ was received as a research gift from Materia Inc. and converted to 1 & 2 via literature procedure. (Love, J. A.; Morgan, J. P.; Trnka, T. M.; Grubbs, R. H. *Angew.* 504 *Chem., Int. Ed.* 2002, 41, 4035-4037, Louie, J.; Grubbs, R. H. *Organometallics* 2002, 21, 2153-2164). All other chemicals were purchased from Sigma Aldrich. Printed photomasks were purchased from CAD/Art Services, Inc. (http://outputcity.com). Silicon coupons were ordered as a pre-diced 4" wafer from Ted Pella (Part #16006). Dichloromethane, ethyl vinyl ether and 5-ethylidene-2-norbornene were first degassed by bubbling argon through for 15 minutes. The lamp used was an 8-watt "MRL-58 Multiple Ray Lamp" from Ultra Violet Products (#UVP 95-0313-01). The 254 nm bulb used was a General Electric germicidal bulb (#GEG8T5, from http://bulbtronics.com). The 352 nm bulb was an Eiko blacklight bulb (#WKF8T5BL, from http://bulbtronics.com). Samples were placed approximately 1.5" away from the bulb during exposure.

Profilometry was performed on a Bruker DektakXT stylus profiler. Optical micrographs were obtained on a Zeiss Axio Observer inverted microscope equipped with a 10× objective. NMR spectra were recorded at room temperature on a Varian Inova 500 (at 500 MHz). The NMR spectra were analyzed on MestReNova software and are reported relative to CD2Cl2 (δ=5.320).

Example 2

Photoinitiated Ring-Opening Metathesis Polymerization (ROMP) of 5-ethylidene-2-norbornene (ENBE) and Dicyclopentadiene A 20 mL vial was charged with 1.3 mg solid catalyst 1, and subsequently injected with 1.5 mL 1,5-cyclooctadiene while stirring rapidly. The mixture gelled almost immediately, and was quenched with 3 mL ethyl vinyl ether after ~10 seconds, and sonicated for ~1 hr. This mixture was concentrated en vacuo to a pale yellow solid and subsequently dissolved in 10 mL 5-ethylidene-2-norbornene by stirring and further sonication. This viscous, pale yellow solution was successfully used as a negative photoresist with a UV lamp (UVP, MRL 58, P/N 95-0313-01, 8 watt/115 V ~60 Hz/0.16 Amps) at both 254 nm and 352 nm (Hg—arc lamps, USHIO). Films of the pre-exposed resist were made by spin-coating or simply by confining the viscous liquid on a surface. Both shadow masks and printed photomasks (OutputCity) proved successful. As well, the photoresist solution was found to remain active and usable for approximately 3 weeks without any apparent change in color or viscosity, when stored in the dark at room temperature. As well, there was no apparent difference in the fidelity of the resulting patterns over the course of this time period. The resist was developed in hexanes, or in a mixture of dichloromethane and hexanes.

Figure 2A:
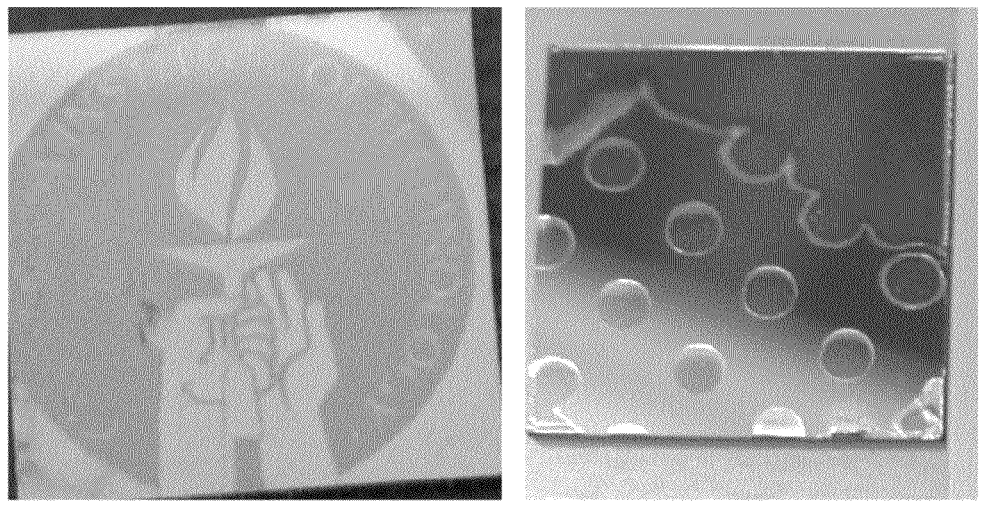
FIG. 2A and FIG. 2B illustrates patterns made by the present invention; see Examples 2 and 6.

FIG. 2A illustrates two patterns created with photoresist in Example 2, both on 1×1 cm Silicon chips. The sample in the left image was irradiated at 352 nm through a mask from outputcity.com. The sample in the right image was irradiated @ 254 nm through an array of holes.

Example 2

In a nitrogen-filled glovebox, two 4 mL vials were each charged with 2.5 mg of complex 2 and 1.0 g of dicyclopentadiene resin 1260B from Materia, Inc. Both vials were removed from the glovebox, one was covered in electrical tape and kept in the dark. The second was placed on its side under a UV lamp (352 nm). The irradiated sample was completely solidified after 45 minutes of irradiation, while the dark sample showed no apparent change in viscosity or color over this same time period.

Example 3

A Representative PLOMP Resist Recipe

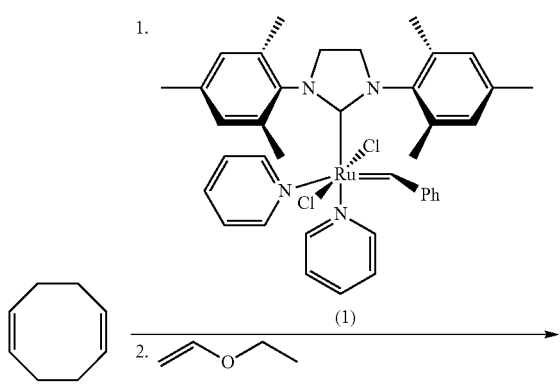

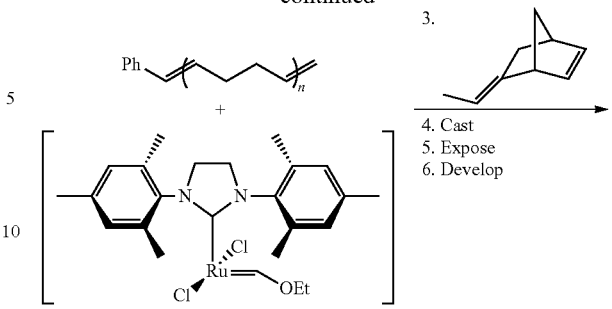

Compound 1 (1.3 mg) was placed under argon and dissolved in 2 mL dichloromethane. To this catalyst solution was quickly added 1.5 mL 1,5-cyclooctadiene, the solution became a semi-solid in 10 seconds and was allowed to react for 1 minute before quenching with 3 mL ethyl vinyl ether. The viscous solution was slowly stirred for 5 minutes, sealed under argon, and sonicated for 1 hour. The volatiles were removed on a rotary evaporator, to yield semisolid poly (COD), colored light yellow by the quenched catalyst (the photoactive vinyl ether complex). Ethylidene norbornene (10 mL) was added to this mixture, which was cooled to 0° C. and sonicated for 1 hour. The partially dissolved mixture was placed on an ice bath and stirred until fully dissolved, while allowing the bath to warm to room temperature. The result is a light yellow, viscous solution weighing approximately 10 grams.

This one-pot preparation from commercially available starting materials can be completed in the span of a few hours. It should be noted that the photoactive vinyl ether complex is sensitive to oxygen, heat and light. Preparation of the resist should be carried out under an inert atmosphere for best results. First, complex 1 is employed to afford the ROMP of 1,5-cyclooctadiene (COD) (Scheme 1). This reaction was sufficiently complete in minutes, and was subsequently quenched with ethyl vinyl ether. After removing the voltailes in vacuo, the linear poly(COD) was dissolved in a difunctional monomer, such as 5-ethylidene-2-norbornene (ENBE). The chemical composition and molecular weight of the linear polymer, the amount of ENBE and the excess of vinyl ether can all be modulated to tune the properties of the photoresist. The presence of some excess vinyl ether was beneficial for mitigating dark polymerization of the resist material. In these PLOMP resists, the high viscosity of the solution as well as the possibility of dative bonding from the surrounding olefins likely contributed to stabilizing the photocatalyst (FIG. 1). Despite the sensitivity of the ruthenium vinyl ether complexes, the viscous resist solutions could be used successfully under ambient benchtop conditions for many weeks.

Example 4

General Film Casting Procedures

Silicon coupons (1 cm×1 cm) were cleaned in a piranha solution (3:1 concentrated $H_2SO_4$: 30% $H_2O_2$), rinsed with copous amounts of deionized water ("Nanopure"), isopropanol and acetone. (Caution! Piranha solution reacts violently with organic matter.) Before spin casting, the coupons were heated to 140-150° C. for 1-2 minutes to drive off adventitious moisture, cooled to room temperature under a stream of argon gas, and quickly loaded onto the spinner. While this pre-heating step was not always necessary, it led to the most reproducible results. Approximately 0.1 mL of the resist solution was deposited on each 1 cm² coupon and the samples were spun between 1500-7000 RPM for 60 seconds to achieve films of varying thickness. These cast films should be exposed and developed quickly, prolonged delay after spinning lead to inconsistent results.

Example 5

Figure 2B:
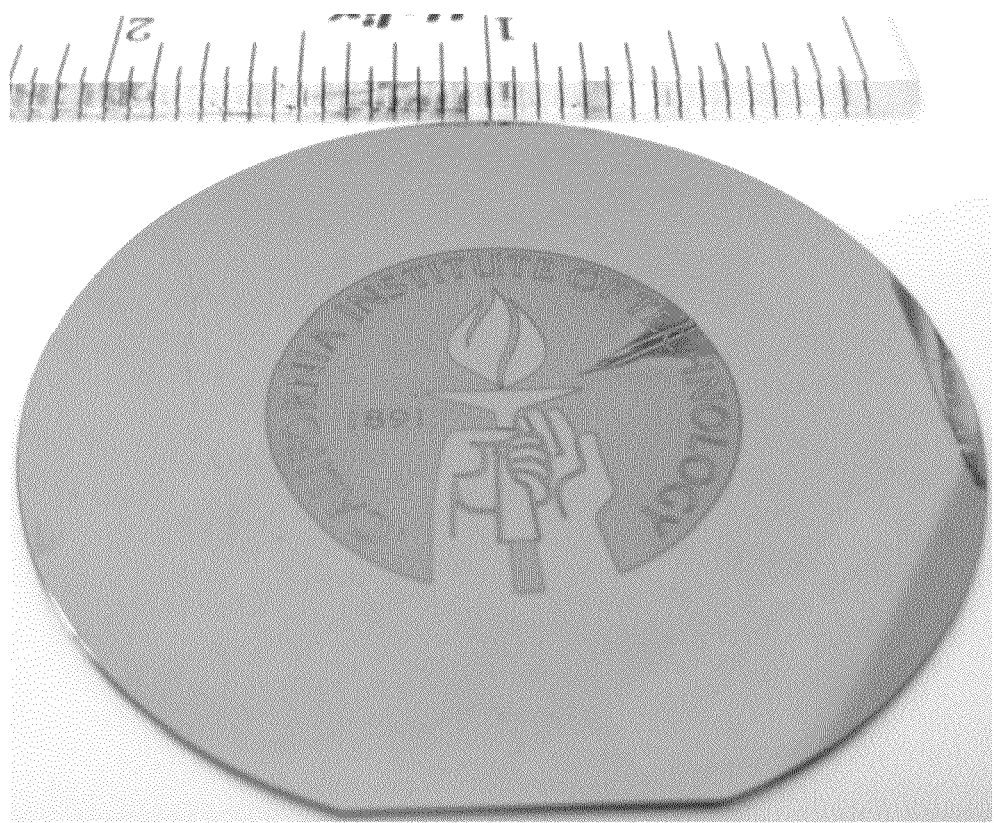

Specific Conditions for the Samples in FIG. 2 and FIG. 2B

These compositions proved to be competent UV photoresists, at both 254 nm and 352 nm. The samples in FIG. 3 and FIG. 2B were prepared by using various dilutions of the standard resist preparation outlined above. For FIG. 3, 1.00 mL of the standard resist described above was diluted with 0.1 mL ENBE. Approximately 0.1 mL of this solution was used to cover the 1 cm² coupons, which were spun at 7000 RPM for 60 seconds. The films were irradiated through the grid test mask for 10 minutes, and developed in 10% dichloromethane/hexanes for 2 minutes. For FIG. 2B, 1.25 mL of the standard resist described above was diluted with 0.75 mL ENBE. The wafer was cleaned using the procedure outlined for the coupons, heated to 150° C. for 2 minutes and cooled under a stream of argon. Approximately 1.2 mL of the solution was used to cover the entire wafer, which was spun at 4000 RPM for 60 seconds. The film was irradiated through the Caltech logo mask for 11.5 minutes, and developed in hexanes for 2 minutes.

Example 6

Supplementary Experiments

To show that the catalyst is necessary for the resist to function, the standard resist preparation was used except the polymer was precipitated into methanol to extract the quenched catalyst. Compound 1 (1.3 mg) was placed under argon and dissolved in 2 mL dichloromethane. To this catalyst solution was quickly added 1.5 mL 1,5-cyclooctadiene, the solution became a semi-solid in 10 seconds and was allowed to react for 1 minute before quenching with 3 mL ethyl vinyl ether. The viscous solution was very slowly stirred for 5 minutes, after which 5 mL methanol was added. The suspension was sonicated for 20 minutes, the brown solution was decanted and the off-white solid polymer was washed three times with 10 mL of methanol. The polymer was dried in vacuo, and dissolved in 10 mL 5-ethylidene-2-norbornene to afford a very pale yellow, viscous solution. This solution was cast as before and exposed for 6 minutes at 254 nm (4 times the standard exposure for the analogous resist) with no evidence of pattern formation. After developing with hexanes, a clean Si surface was recovered. Additionally, prolonged irradiation of pure ENBE at both 254 nm and 352 nm did not render any change in viscosity or other evidence of crosslinking. To support the hypothesis that the ruthenium vinyl ether complex was intact inside the PLOMP resist, the ¹H NMR spectra of a PLOMP resist and complex 2 were compared. The resist was prepared by the standard recipe above. The spectra strongly supported the proposed composition of the PLOMP photoresist; the alkylidene protons in each spectrum were less than 1 ppm apart.

Example 7

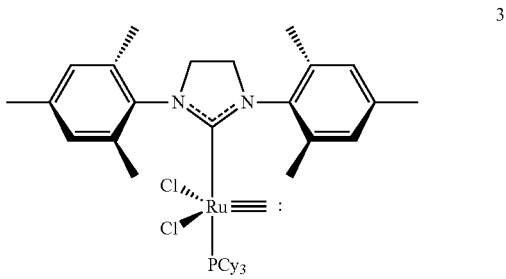

The ruthenium carbide 3 (2.9 mg) was added to a small vial with a magnetic stir bar and dissolved in an inert atmosphere in 100 microliters of methylene chloride. Materia DCPD (dicyclopentadiene) Resin 1260B (1.050 g) was added, and the solution was stirred in the dark for 3 minutes. A 2 cm×2 cm si coupon with a 290 nm thermal oxide was coated with 0.25 mL of the resulting solution, and spun at 1500 rpm for 30 seconds. The DCPD resin did not wet the substrate well, but a thin film was observed around the edges. Another piece of silicon was used as a mask, placed diagonally across the substrate. The assembly was placed about 1 inch below a UV-C lamp (peak λ≈254 nm) and exposed for 8 minutes. After exposure, the area under the mask remained liquid, while the exposed areas polymerized to a solid film. The unpolymerized DCPD was rinsed gently with acetone to yield a lithographically defined thin film of poly-DCPD.

As those skilled in the art will appreciate, numerous modifications and variations of the present invention are possible in light of these teachings, and all such are contemplated hereby. For example, in addition to the embodiments described herein, the present invention contemplates and claims those inventions resulting from the combination of features of the invention cited herein and those of the cited prior art references which complement the features of the present invention. Similarly, it will be appreciated that any described material, feature, or article may be used in combination with any other material, feature, or article, and such combinations are considered within the scope of this invention.

The disclosures of each patent, patent application, and publication cited or described in this document are hereby incorporated herein by reference, each in its entirety, for all purposes.

What is claimed:
1. A method of metathesizing an unsaturated organic precursor comprising irradiating a Fischer-type carbene ruthenium catalyst with at least one wavelength of light in the presence of at least one unsaturated organic precursor, so as to metathesize at least one alkene or one alkyne bond;
  wherein the Fischer-type carbene ruthenium catalyst comprises a ruthenium carbene moiety, Ru=C(R¹)—Y—R², and where
  R¹ and R² are independently hydrogen, optionally substituted hydrocarbyl or an optionally substituted heteroatom-containing hydrocarbyl, or may be linked to form a cyclic group, which may be aliphatic or aromatic, and may contain substituents and/or heteroatoms; and Y is O, N—R$^1$, or S.

2. The method of claim 1, wherein the Fischer-type carbene ruthenium catalyst is generated in situ by the reaction between:

a quenching agent of

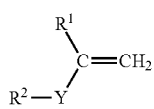

and a Grubbs-type metathesis catalyst of Formula (I)

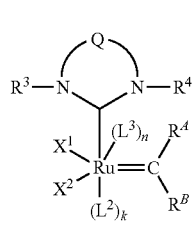

(I)

wherein:

L$^2$, and L$^3$ are neutral electron donor ligands;

k and n are independently 0 or 1;

X$^1$ and X$^2$ are anionic ligands;

Y is O, N—R$^1$, or S; and

Q is a two-atom linkage having the structure —CR$^{11}$R$^{12}$—CR$^{13}$R$^{14}$— or —CR$^{11}$=CR$^{13}$—, wherein R$^{11}$, R$^{12}$, R$^{13}$, and R$^{14}$ are independently hydrogen, hydrocarbyl, substituted hydrocarbyl, heteroatom-containing hydrocarbyl, substituted heteroatom-containing hydrocarbyl, or functional groups;

R$^1$ and R$^2$ are independently hydrogen, optionally substituted hydrocarbyl or optionally substituted heteroatom-containing hydrocarbyl, or may be linked to form a cyclic group, which may be aliphatic or aromatic, and may contain substituents and/or heteroatoms;

R$^A$, and R$^B$ are independently hydrogen, optionally substituted hydrocarbyl or optionally substituted heteroatom-containing hydrocarbyl, or may be linked to form a cyclic group, which may be aliphatic or aromatic, and may contain substituents and/or heteroatoms;

R$^3$ and R$^4$ are independently hydrogen, optionally substituted hydrocarbyl, or optionally substituted heteroatom-containing hydrocarbyl; and wherein any two or more of X$^1$, X$^2$, L$^1$, L$^2$, L$^3$, R$^1$, and R$^2$ can be taken together to form one or more cyclic groups.

3. The method of claim 1, wherein the Fischer-type carbene ruthenium catalyst is represented by the structure of Formula (II):

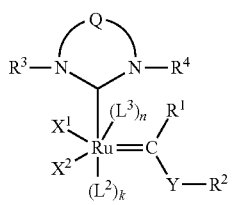

(II)

wherein

L$^2$, and L$^3$ are neutral electron donor ligands;

k and n are independently 0 or 1;

X$^1$ and X$^2$ are anionic ligands;

Y is O, N—R$^1$, or S; and

Q is a two-atom linkage having the structure —CR$^{11}$R$^{12}$—CR$^{13}$R$^{14}$— or —CR$^{11}$=CR$^{13}$—, wherein R$^{11}$, R$^{12}$, R$^{13}$, and R$^{14}$ are independently hydrogen, hydrocarbyl, substituted hydrocarbyl, heteroatom-containing hydrocarbyl, substituted heteroatom-containing hydrocarbyl, or functional groups;

R$^1$ and R$^2$ are independently hydrogen, optionally substituted hydrocarbyl or optionally substituted heteroatom-containing hydrocarbyl, or may be linked to form a cyclic group, which may be aliphatic or aromatic, and may contain substituents and/or heteroatoms;

R$^3$ and R$^4$ are independently hydrogen, optionally substituted hydrocarbyl, or optionally substituted heteroatom-containing hydrocarbyl; and wherein any two or more of X$^1$, X$^2$, L$^1$, L$^2$, L$^3$, R$^1$, and R$^2$ can be taken together to form one or more cyclic groups.

4. The method of claim 3, wherein the Ru=C(R$^1$)(Y—R$^2$) moiety is a substituted vinyl ether carbene.

5. The method of 4, wherein R$^2$ is C$_{1-6}$ alkyl.

6. The method of claim 2, wherein Q is —CH$_2$—CH$_2$— and R$^3$ and R$^4$ are mesityl.

7. The method of claim 1, wherein the metathesis, upon irradiation, proceeds at a rate faster than the metathesis in the absence of light.

8. The method of claim 1, wherein the Fischer-type carbene ruthenium catalyst is irradiated with a light comprising a wavelength in a range of from about 220 to about 440 nm.

9. The method of claim 1, wherein the Fischer-type carbene ruthenium catalyst is irradiated with a light having an intensity in a range of about 2 watts to about 6000 watts at at least one wavelength in a range of about 220 to 440 nm.

10. The method of claim 1, wherein the Fischer-type carbene ruthenium catalyst and at least unsaturated organic precursor are dissolved in a solvent.

11. The method of claim 1, wherein the Fischer-type carbene ruthenium catalyst is admixed or dissolved in at least one unsaturated organic precursor.

12. The method of claim 1, wherein the metathesis results in the cross-metathesis of the organic precursors.

13. The method of claim 1, wherein the metathesis results in the polymerization of the at least one olefin precursor.

14. The method of claim 13, wherein the at least one unsaturated organic precursor is a cyclic unsaturated compound.

15. A photosensitive composition comprising a Fischer-type carbene ruthenium catalyst of claim 1 admixed or dissolved within a matrix of at least one unsaturated organic precursor, wherein the ruthenium carbene catalyst is activated by irradiation of light comprising at least one wavelength in a range of from about 220 to about 440 nm.

16. The photosensitive composition of claim 15, wherein the Fischer-type carbene ruthenium catalyst is generated in situ by the reaction between:
a quenching agent of

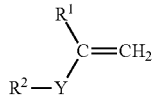

and a Grubbs-type metathesis catalyst of Formula (I)

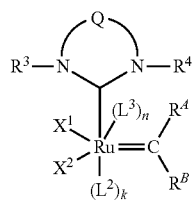

wherein:
$L^2$, and $L^3$ are neutral electron donor ligands;
k and n are independently 0 or 1;
$X^1$ and $X^2$ are anionic ligands;
Y is O, N—$R^1$, or S; and
Q is a two-atom linkage having the structure —$CR^{11}R^{12}$—$CR^{13}R^{14}$— or —$CR^{11}$=$CR^{13}$—, wherein $R^{11}$, $R^{12}$, $R^{13}$, and $R^{14}$ are independently hydrogen, hydrocarbyl, substituted hydrocarbyl, heteroatom-containing hydrocarbyl, substituted heteroatom-containing hydrocarbyl, or functional groups;
$R^1$ and $R^2$ are independently hydrogen, optionally substituted hydrocarbyl, or optionally substituted heteroatom-containing hydrocarbyl, or may be linked to form a cyclic group, which may be aliphatic or aromatic, and may contain substituents and/or heteroatoms;
$R^A$ and $R^B$ are independently hydrogen, optionally substituted hydrocarbyl, or optionally substituted heteroatom-containing hydrocarbyl, or may be linked to form a cyclic group, which may be aliphatic or aromatic, and may contain substituents and/or heteroatoms;
$R^3$ and $R^4$ are independently hydrogen, optionally substituted hydrocarbyl, or optionally substituted heteroatom-containing hydrocarbyl; and
wherein any two or more of $X^1$, $X^2$, $L^1$, $L^2$, $L^3$, $R^1$, and $R^2$ can be taken together to form one or more cyclic groups.

17. The photosensitive composition of claim 15, wherein the Fischer-type carbene ruthenium catalyst is represented by the structure of Formula (II):

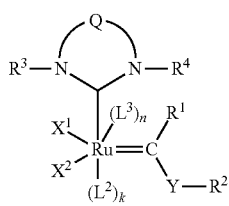

wherein
$L^2$, and $L^3$ are neutral electron donor ligands;
k and n are independently 0 or 1;
$X^1$ and $X^2$ are anionic ligands;
Y is O, N—$R^1$, or S; and
Q is a two-atom linkage having the structure —$CR^{11}R^{12}$—$CR^{13}R^{14}$— or —$CR^{11}$=$CR^{13}$—, wherein $R^{11}$, $R^{12}$, $R^{13}$, and $R^{14}$ are independently hydrogen, hydrocarbyl, substituted hydrocarbyl, heteroatom-containing hydrocarbyl, substituted heteroatom-containing hydrocarbyl, or functional groups;
$R^1$ and $R^2$ are independently hydrogen, optionally substituted hydrocarbyl, an optionally substituted heteroatom-containing hydrocarbyl, or may be linked to form a cyclic group, which may be aliphatic or aromatic, and may contain substituents and/or heteroatoms;
$R^3$ and $R^4$ are independently hydrogen, optionally substituted hydrocarbyl, or optionally substituted heteroatom-containing hydrocarbyl; and
wherein any two or more of $X^1$, $X^2$, $L^1$, $L^2$, $L^3$, $R^1$, and $R^2$ can be taken together to form one or more cyclic groups.

18. The photosensitive composition of claim 15, wherein the at least one unsaturated organic precursor comprises at least one alkene, alkyne, or both alkene and alkyne moieties and is capable of polymerizing when metathesized.

19. The photosensitive composition of claim 15, wherein the at least one unsaturated organic precursor comprises a cyclic alkene or an alicyclic di-alkene.

20. The photosensitive composition of claim 15, wherein the Fischer-type carbene ruthenium catalyst is present at a concentration in a range of from about 0.001% to about 5% by weight, relative to the weight of the entire composition.

21. The photosensitive composition of claim 15, wherein the composition has a viscosity capable of being spin coated, dip coated, or sprayed.

22. The photosensitive composition of claim 15, wherein the composition has a form of a gelled or solid film.

23. A method of patterning a polymeric image on a substrate, said method comprising;
(a) depositing a layer of the photosensitive composition of claim 15 on a substrate;
(b) irradiating a portion of the layer of photosensitive composition with a light comprising a wavelength in a range of from about 220 to about 440 nm, so as to polymerize the irradiated portion of the layer, thereby providing a patterned layer of polymerized and unpolymerized regions.

24. The method of claim 23, wherein the photosensitive composition is deposited by spin coating, dip coating, or spray coating.

25. The method of claim 23, wherein photosensitive composition is a gelled or solid film and is deposited by laminating on the substrate.

26. The method of claim 23, wherein the irradiated portion is patterned by a photomask.

27. The method of claim 23, wherein the irradiated portion is patterned by a direct writing application of light.

28. The method of claim 23, wherein the irradiated portion is patterned by an interference or diffraction gradient lithography.

29. The method of claim 23, wherein the light has an intensity in a range of about 2 watts to about 6000 watts at at least one wavelength in the range of about 220 to 440 nm.

30. The method of claim 23, wherein the patterned layer comprises features having dimensions on the nanometer or micron scale.

31. The method of claim 23, further comprising removing the unpolymerized region of the pattern.

32. A patterned polymer layer prepared according to claim 23, or an article containing said patterned polymer layer.

33. The method of claim 1, wherein Y is O or N—$R^1$.

34. The method of claim 33, wherein the ruthenium catalyst further comprises an imidazolidinyl carbene ligand.

35. The method of claim 34, wherein the imidazolidinyl carbene ligand has a structure:

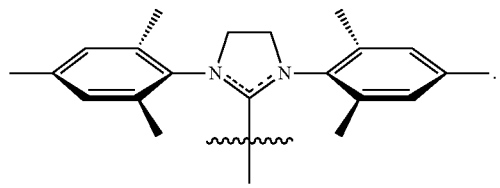

36. The photosensitive composition of claim 15, wherein the Fischer-type carbene ruthenium catalyst comprises a ruthenium carbene moiety, Ru=C($R^1$)—Y—$R^2$, where $R^1$ and $R^2$ are independently hydrogen, optionally substituted hydrocarbyl, or optionally substituted heteroatom-containing hydrocarbyl, or may be linked to form a cyclic group, which may be aliphatic or aromatic, and may contain substituents and/or heteroatoms; and Y is O, N—$R^1$, or S.

37. The photosensitive composition of claim 36, wherein Y is O or N—$R^1$.

38. The photosensitive composition of claim 37, wherein the ruthenium catalyst further comprises an imidazolidinyl carbene ligand.

39. The photosensitive composition of claim 38, wherein the imidazolidinyl carbene ligand has a structure:

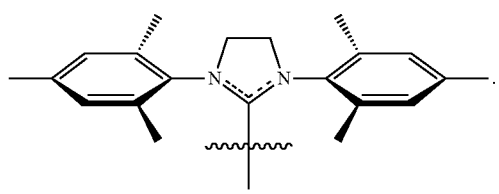

40. The method of claim 5, wherein $R^2$ is ethyl or butyl.

* * * * *